(12) United States Patent
Campbell

(10) Patent No.: US 6,376,261 B1
(45) Date of Patent: Apr. 23, 2002

(54) METHOD FOR VARYING NITRIDE STRIP MAKEUP PROCESS BASED ON FIELD OXIDE LOSS AND DEFECT COUNT

(75) Inventor: William Jarrett Campbell, Austin, TX (US)

(73) Assignee: Advanced Micro Devices Inc., Austin, TX (US)

( * ) Notice: Subject to any disclaimer, the term of this patent is extended or adjusted under 35 U.S.C. 154(b) by 0 days.

(21) Appl. No.: 09/476,893

(22) Filed: Jan. 3, 2000

(51) Int. Cl.[7] .............................................. H01L 21/00
(52) U.S. Cl. ................................ 438/8; 438/5; 438/14; 438/17; 257/48
(58) Field of Search ........................... 438/5, 8, 11, 12, 438/14, 689, 17, 16; 134/113; 257/48

(56) References Cited

U.S. PATENT DOCUMENTS

| | | |
|---|---|---|
| 5,126,028 A | 6/1992 | Hurwitt et al. ......... 204/192.13 |
| 5,131,752 A | 7/1992 | Yu et al. ..................... 427/10 |
| 5,270,222 A | 12/1993 | Moslehi ......................... 438/7 |
| 5,503,707 A | 4/1996 | Maung et al. ............ 156/626.1 |
| 5,622,636 A | 4/1997 | Huh et al. ..................... 438/5 |
| 5,779,927 A | * 7/1998 | Lo ................................ 216/84 |
| 5,955,139 A | 9/1999 | Iturralde ......................... 427/9 |

OTHER PUBLICATIONS

Article entitled, "In–Situ Chemical Concentration Control for Wafer Wet Cleaning"; authors Ismail Kashkoush, Rich Novak and Eric Brause; published in the May/Jun. 1998 *Journal of the IEST*; pp. 24–30.

* cited by examiner

Primary Examiner—Charles Bowers
Assistant Examiner—Hsien-Ming Lee
(74) Attorney, Agent, or Firm—Williams, Morgan & Amerson

(57) ABSTRACT

A method is provided for manufacturing, the method including processing a first workpiece in a nitride processing step and measuring a thickness of a field oxide feature formed on the first workpiece. The method also includes forming an output signal corresponding to the thickness of the field oxide feature. In addition, the method includes feeding back a control signal based on the output signal to adjust processing performed on a second workpiece in the nitride processing step to adjust a thickness of a field oxide feature formed on the second workpiece toward at least a predetermined threshold value.

30 Claims, 24 Drawing Sheets

METHOD FOR VARYING NITRIDE STRIP MAKEUP PROCESS BASED ON FIELD OXIDE LOSS AND DEFECT COUNT

BACKGROUND OF THE INVENTION

1. Field of the Invention

This invention relates generally to semiconductor fabrication technology, and, more particularly, to a method for manufacturing a workpiece.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are the field oxide (FOX) thickness and the residual FOX defect count following a nitride stripping and/or etching process step. As consecutive lots of workpieces (such as silicon wafers with various process layers formed thereon) are processed through a nitride stripping and/or etching process step, increasing silicon (Si) concentration in the stripping and/or etching bath causes the FOX also to etch in varying amounts. For example, when hot aqueous phosphoric acid ($H_3PO_4$) is used to selectively etch silicon nitride ($Si_3N_4$), the $Si_3N_4$ etches away fairly steadily, at roughly ten times the initial etch rate of the FOX ($SiO_2$). However, when the $H_3PO_4$ bath is fresh and the Si concentration is relatively low, the initial etch rate of the FOX ($SiO_2$) is much faster than the later etch rate of the FOX ($SiO_2$), as the $H_3PO_4$ bath ages and the Si concentration increases. This causes the FOX thicknesses to increase with time, as the $H_3PO_4$ bath ages and the Si concentration increases. In particular, the FOX thicknesses typically vary from run to run and/or batch to batch, leading to varying device performance and an increased number of residual FOX defects, lowering the workpiece throughput and increasing the workpiece manufacturing costs. In addition, if the Si concentration oversaturates, Si may precipitate, contaminating the workpiece(s) and increasing the number of defects.

The present invention is directed to overcoming, or at least reducing the effects of, one or more of the problems set forth above.

SUMMARY OF THE INVENTION

In one aspect of the present invention, a method is provided for manufacturing, the method including processing a first workpiece in a nitride processing step and measuring a thickness of a field oxide feature formed on the first workpiece. The method also includes forming an output signal corresponding to the thickness of the field oxide feature. In addition, the method includes feeding back a control signal based on the output signal to adjust processing performed on a second workpiece in the nitride processing step to adjust a thickness of a field oxide feature formed on the second workpiece toward at least a predetermined threshold value.

In another aspect of the present invention, a computer-readable, program storage device is provided, encoded with instructions that, when executed by a computer, perform a method for manufacturing a workpiece, the method including processing a first workpiece in a nitride processing step and measuring a thickness of a field oxide feature formed on the first workpiece. The method also includes forming an output signal corresponding to the thickness of the field oxide feature. In addition, the method includes feeding back a control signal based on the output signal to adjust processing performed on a second workpiece in the nitride processing step to adjust a thickness of a field oxide feature formed on the second workpiece toward at least a predetermined threshold value.

In yet another aspect of the present invention, a computer programmed to perform a method of manufacturing is provided, the method including processing a first workpiece in a nitride processing step and measuring a thickness of a field oxide feature formed on the first workpiece. The method also includes forming an output signal corresponding to the thickness of the field oxide feature. In addition, the method includes feeding back a control signal based on the output signal to adjust processing performed on a second workpiece in the nitride processing step to adjust a thickness of a field oxide feature formed on the second workpiece toward at least a predetermined threshold value.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–2, 5–12, 14–15 and 17 illustrate schematically a flow chart for various embodiments of a method for manufacturing according to the present invention;

FIGS. 3–4 illustrate schematically various embodiments of field oxide (FOX) features used in various embodiments of a method for manufacturing according to the present invention; and FIGS. 13, 16 and 18–21 illustrate schematically various embodiments of displays used in various embodiments of a method for manufacturing according to the present invention;

FIG. 22 schematically illustrates a method for fabricating a semiconductor device practiced in accordance with the present invention;

FIG. 23 schematically illustrates workpieces being processed using a nitride strip processing tool, using a plurality of control input signals, in accordance with the present invention;

FIGS. 24–25 schematically illustrate one particular embodiment of the process and tool in FIG. 23; and FIG. 26 schematically illustrates one particular embodiment of the method of FIG. 22 as may be practiced with the process and tool of FIGS. 24–25.

Figure 1:
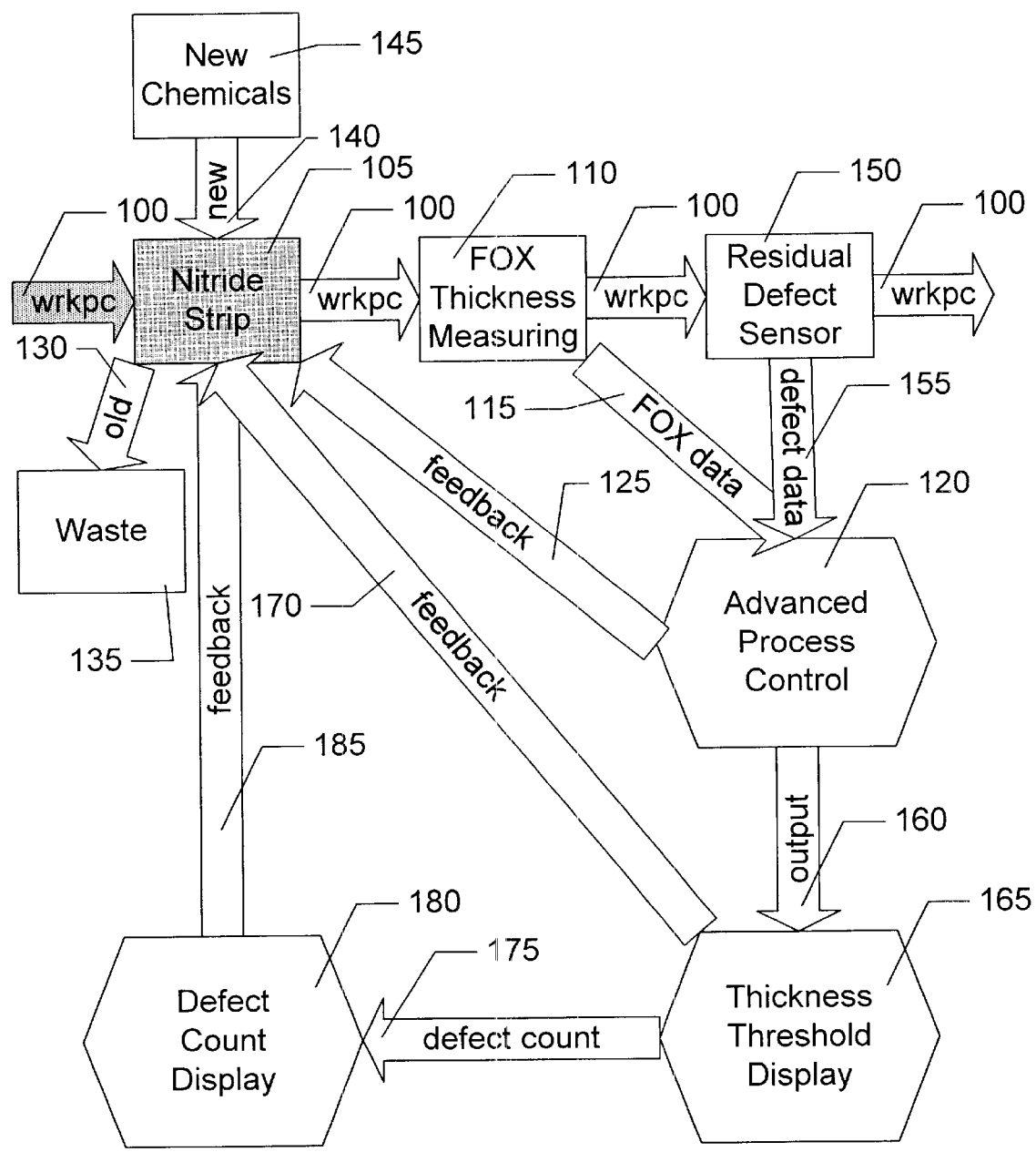
FIGS. 1–26 illustrate schematically various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–26. As shown in FIG. 1, a workpiece 100, such as a semiconducting substrate or wafer, having one or more process layers disposed thereon, is delivered to a nitride processing step 105. The nitride processing step 105 may include nitride stripping and/or nitride etching, for example. The nitride stripping and/or nitride etching may be a wet chemical process involving hot aqueous phosphoric acid ($H_3PO_4$), for example.

Figure 2:
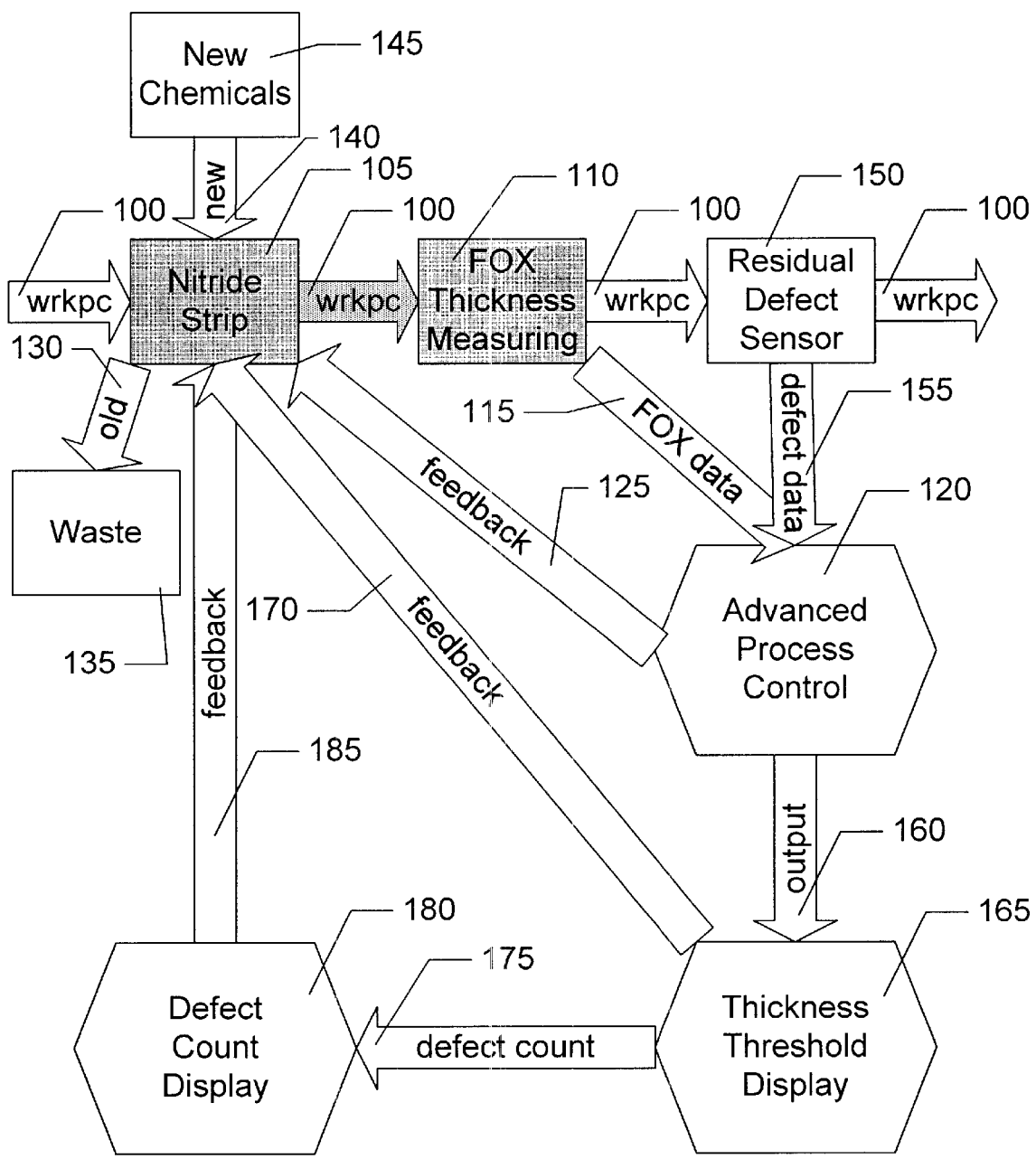

As shown in FIG. 2, the workpiece 100 is sent from the nitride processing step 105 and delivered to a field oxide (FOX) thickness measuring step 110. In the measuring step 110, the FOX thickness of at least one feature on the workpiece 100 is measured by a metrology or measuring tool (not shown).

Figure 3:
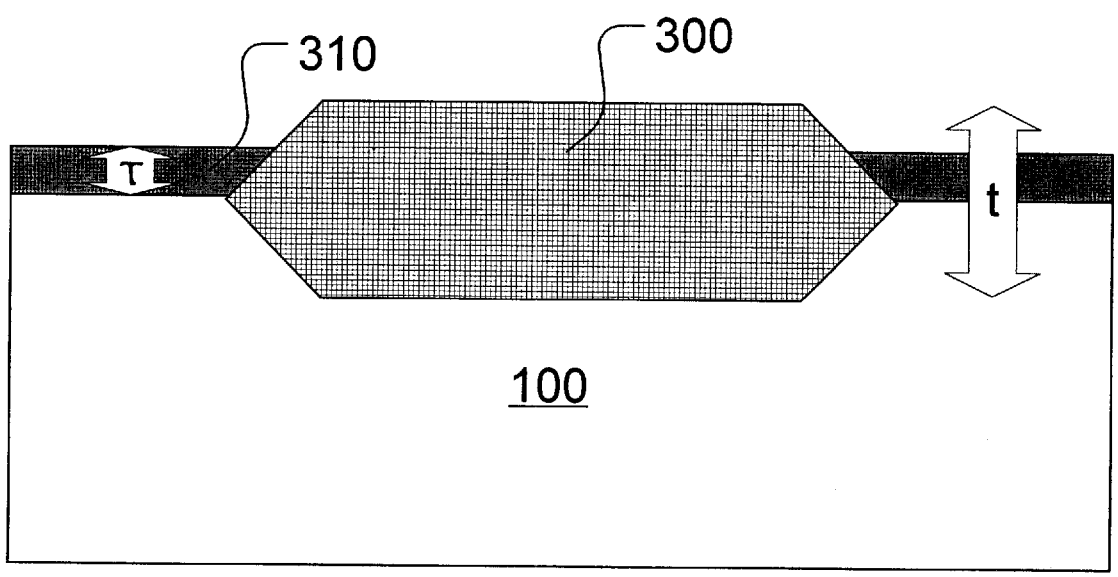

As shown in FIG. 3, the workpiece 100 may have a FOX feature 300 disposed thereon. The FOX feature 300 may be used for electrical isolation of semiconductor devices such as transistors (not shown) subsequently formed on the workpiece 100. Alternatively, the FOX feature 300 may be formed on the workpiece 100 specifically as a test structure used to monitor the nitride stripping and/or nitride etching of the nitride processing step 105. A silicon nitride ($Si_3N_4$) layer 310 may be formed above the workpiece 100 and adjacent the FOX feature 300. The $Si_3N_4$ layer 310 may be removed by the nitride stripping and/or nitride etching of the nitride processing step 105. The $Si_3N_4$ layer 310 may have a thickness τ in a range from approximately 1500–2000 Ångstroms (Å) before the nitride processing step 105, and a thickness τ of about 0 Å subsequent to the nitride processing step 105. Similarly, the FOX feature 300 may have a thickness t in a range from approximately 4000–5500 Å before the nitride processing step 105, and a thickness t in a range from approximately 4000–5000 Å subsequent to the nitride processing step 105. Typically, about 0–500 Å of the FOX feature 300 may be etched away in the nitride processing step 105. In various illustrative embodiments of the present invention, a predetermined threshold thickness value of FOX features such as the FOX feature 300 may be in a range of approximately 4000–5000 Å, subsequent to the nitride processing step 105.

Figure 4A:
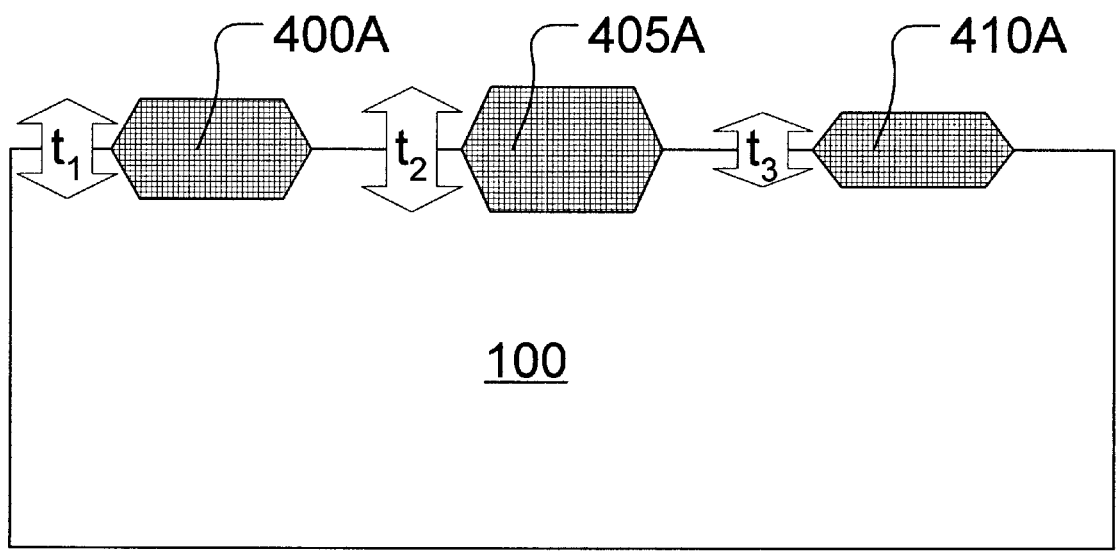

As shown in FIG. 4A, the workpiece 100 may have several FOX features 400A, 405A and 410A, respectively, disposed thereon. One or more of the FOX features 400A, 405A and 410A may be used for electrical isolation of semiconductor devices such as transistors (not shown) subsequently formed on the workpiece 100. Alternatively, one or more of the FOX features 400A, 405A and 410A may be formed on the workpiece 100 specifically as a test structure used to monitor the nitride stripping and/or nitride etching of the nitride processing step 105. The FOX features 400A, 405A and 410A may have respective thicknesses $t_1$, $t_2$ and $t_3$ in a range from approximately 4000–5000 Å subsequent to the nitride processing step 105.

As shown in FIG. 2, in the FOX thickness measuring step 110, the metrology or measuring tool (not shown) may measure the thickness t of the FOX feature 300 (see FIG. 3) disposed on the workpiece 100, producing FOX data 115 indicative of the thickness t of the measured FOX feature 300. In alternative embodiments, the metrology or measuring tool (not shown) in the FOX thickness measuring step 110 may measure the respective thicknesses $t_1$, $t_2$ and $t_3$ of more than one of the FOX features 400A, 405A and 410A (see FIG. 4A) disposed on the workpiece 100, producing FOX data 115 indicative of the median and/or mean thickness of the measured FOX features 400A, 405A and 410A. In one illustrative embodiment, a scanning electron microscope (SEM) is used to perform the FOX thickness measurements of the FOX features formed to have thickness t, producing sample thickness values $t_1, t_2, \ldots, t_m$, where m is the total number of the FOX features (similar to the FOX features 400A, 405A and 410A in FIG. 4A) that are measured by the SEM (e.g., m=3 in FIG. 3).

As discussed above, as consecutive lots of workpieces (such as silicon wafers with various process layers formed thereon) are processed through a conventional nitride stripping and/or etching process step, increasing silicon (Si) concentration in the stripping and/or etching bath causes the FOX also to etch in varying amounts. For example, when hot aqueous hosphoric acid ($H_3PO_4$) is used to selectively etch silicon nitride ($Si_3N_4$), the $Si_3N_4$ etches way fairly steadily, at roughly ten times the initial etch rate of the FOX ($SiO_2$). However, when the $H_3PO_4$ bath is fresh and the Si concentration is relatively low, the initial etch rate of the FOX ($SiO_2$) is much faster than the later etch rate of the FOX ($SiO_2$), as the $H_3PO_4$ bath ages and the Si concentration increases, in conventional nitride stripping. This causes the FOX thicknesses to increase with time, as the $H_3PO_4$ bath ages and the Si concentration increases, in conventional nitride stripping. In particular, the FOX thicknesses typically vary from run to run and/or batch to batch, in conventional nitride stripping, as shown schematically by comparing FIG. 4A with FIG. 4B.

Figure 4B:
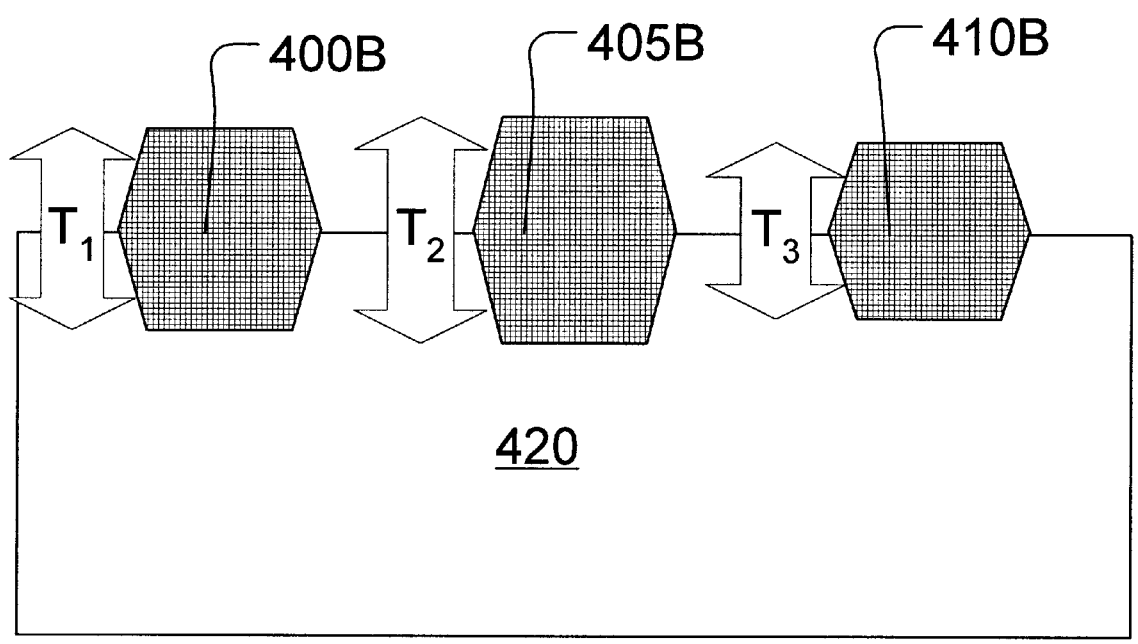

As shown in FIG. 4B, a conventional workpiece 420 may have several FOX features 400B, 405B and 410B, respectively, disposed thereon. The FOX features 400B, 405B and 410B may have respective thicknesses $T_1$, $T_2$ and $T_3$ that are each larger than the respective thicknesses $t_1$, $t_2$ and $t_3$ of the FOX features 400A, 405A and 410A disposed on the workpiece 100, as shown in FIG. 4A. The conventional workpiece 420 is shown in FIG. 4B as it would appear after conventional nitride stripping in an aged $H_3PO_4$ bath, having an increased Si concentration, relative to the $H_3PO4$ bath in which the workpiece 100, as shown in FIG. 4A, had been processed. By way of contrast, any of the various illustrative embodiments of the present invention reduce such FOX thickness variations from run to run and/or batch to batch.

Figure 5:
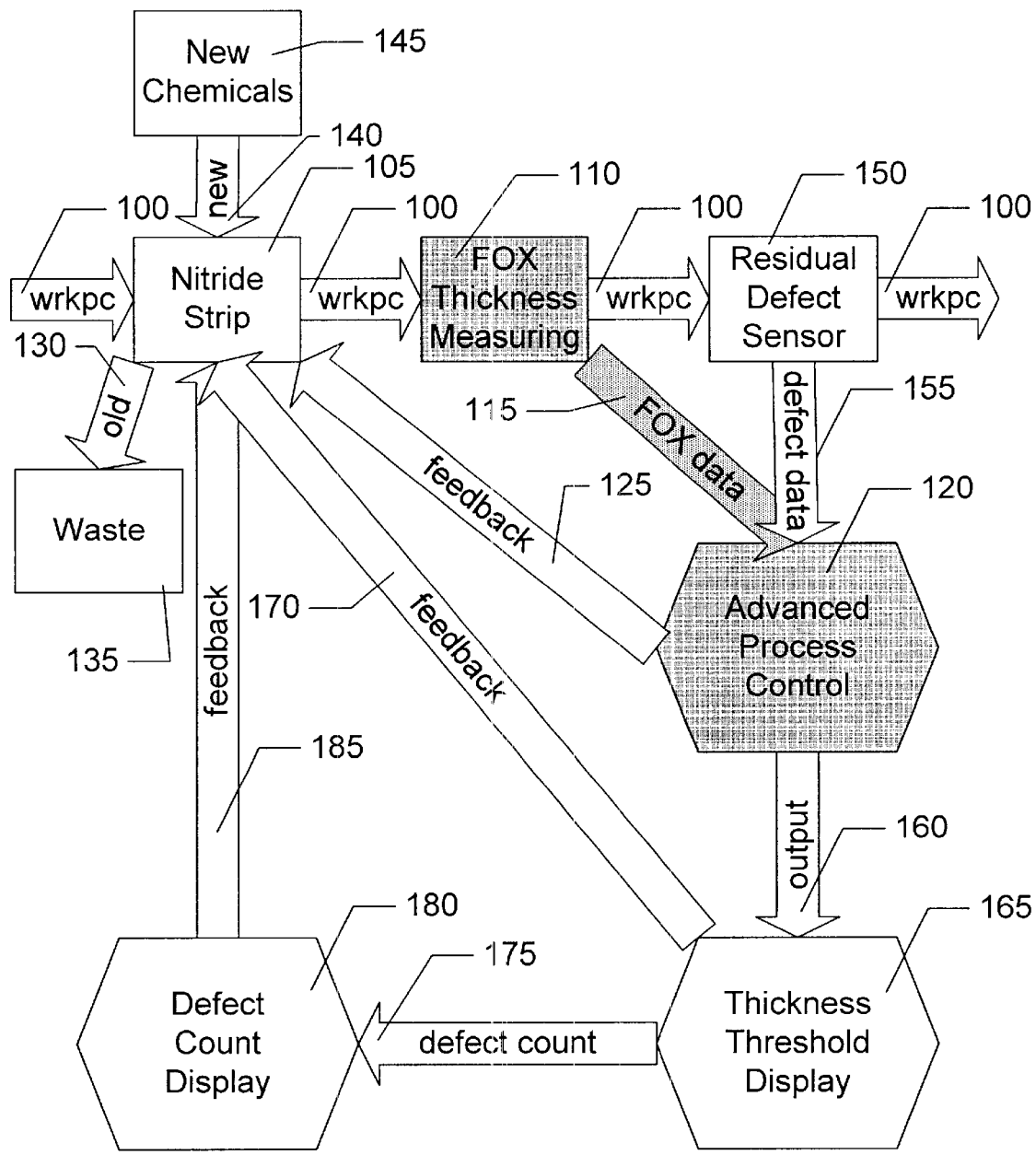

As shown in FIG. 5, the FOX data 115 is sent from the FOX thickness measuring step 110 to an Advanced Process Control (APC) system monitor/controller 120. In the APC system monitor/controller 120, the FOX data 115 may be used to monitor and control the processing taking place in the nitride processing step 105.

Figure 6:
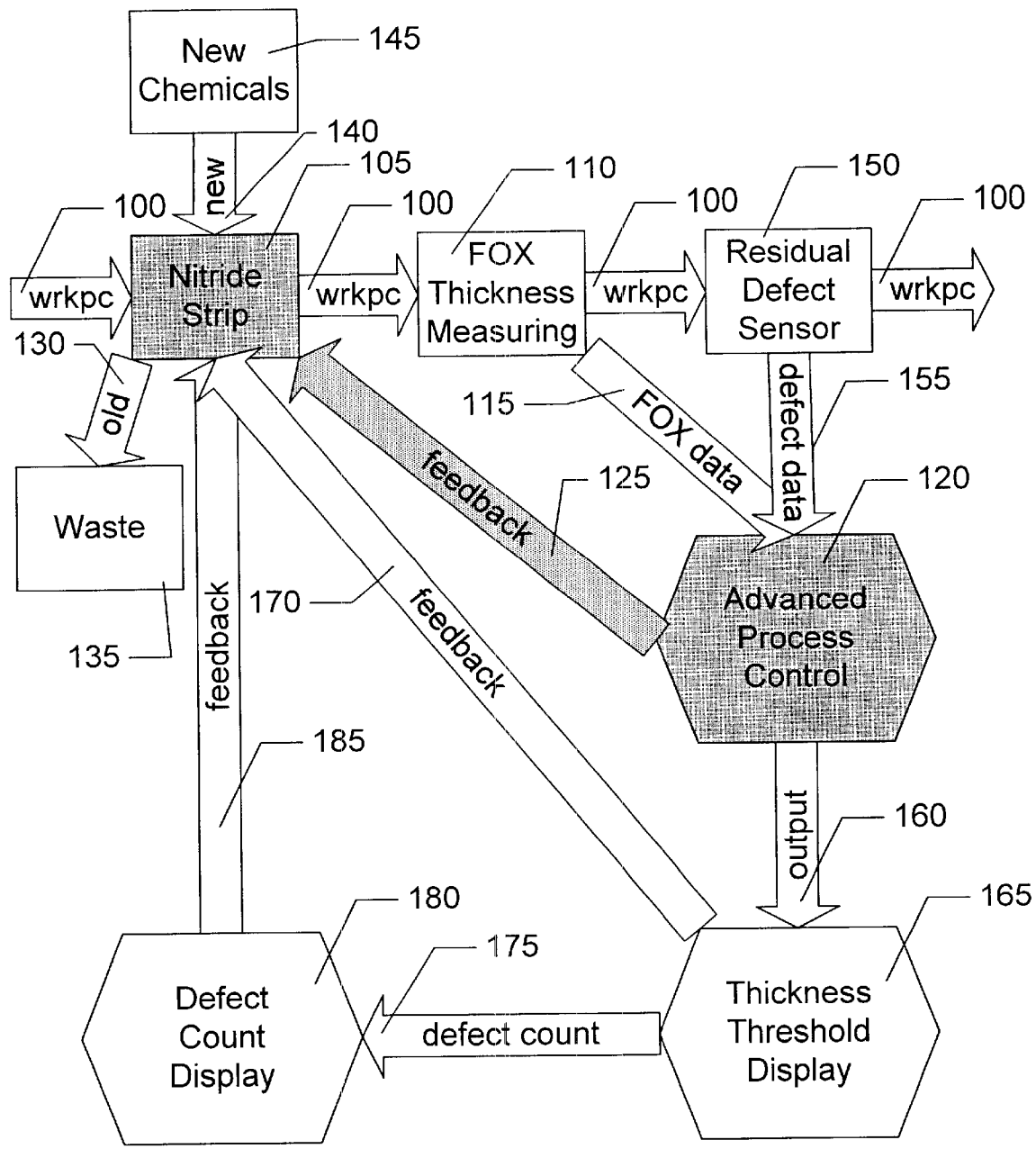

As shown in FIG. 6, a feedback control signal 125 may be sent from the APC system monitor/controller 120 to the nitride processing step 105, for example, depending on the FOX data 115 sent from the FOX thickness measuring step 110. The feedback control signal 125 may be used to adjust the processing performed in the nitride processing step 105 to adjust the thickness t of a FOX feature formed on a subsequent workpiece (not shown) processed in the nitride processing step 105 toward at least a predetermined threshold value. In one illustrative embodiment, the thickness t of the FOX feature formed on the subsequent workpiece (not shown) processed in the nitride processing step 105 may be in a range of approximately 4000–5000 Å. In various illustrative embodiments of the present invention, the predetermined threshold thickness value (of FOX features such as the FOX feature 300) may be in a range of approximately 4000–5000 Å.

Figure 7:
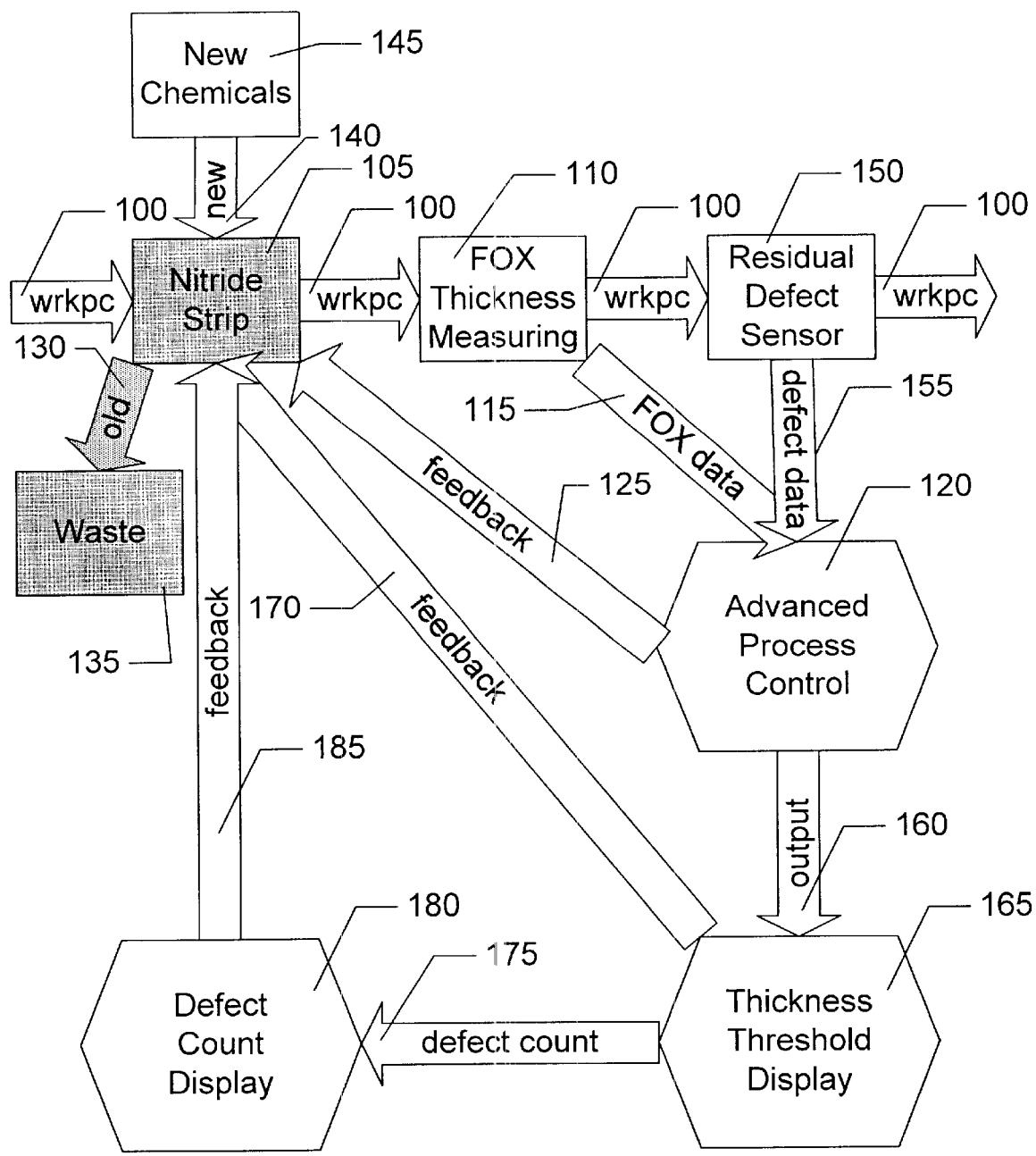

As shown in FIG. 7, one response to the feedback control signal 125 sent from the APC system monitor/controller 120 to the nitride processing step 105 may be to drain an old portion 130 of a chemical bath (not shown) used in the nitride processing step 105 into a waste outlet 135. One of the factors contributing to the variation of the thickness t of the FOX feature 300 formed on the workpiece 100 is the concentration of silicon (Si) in the chemical bath (not shown) used in the nitride processing step 105. By draining the old portion 130 of the chemical bath (not shown) into the waste outlet 135, the concentration of Si may be reduced in a case where the chemical bath is not well stirred so that the concentration of Si may be greater toward the bottom of the chemical bath, for example. In one illustrative embodiment, the concentration of silicon (Si) after the old portion 130 has been drained into the waste outlet 135 may be in a range of approximately 10–100 parts per billion (ppb).

Figure 8:
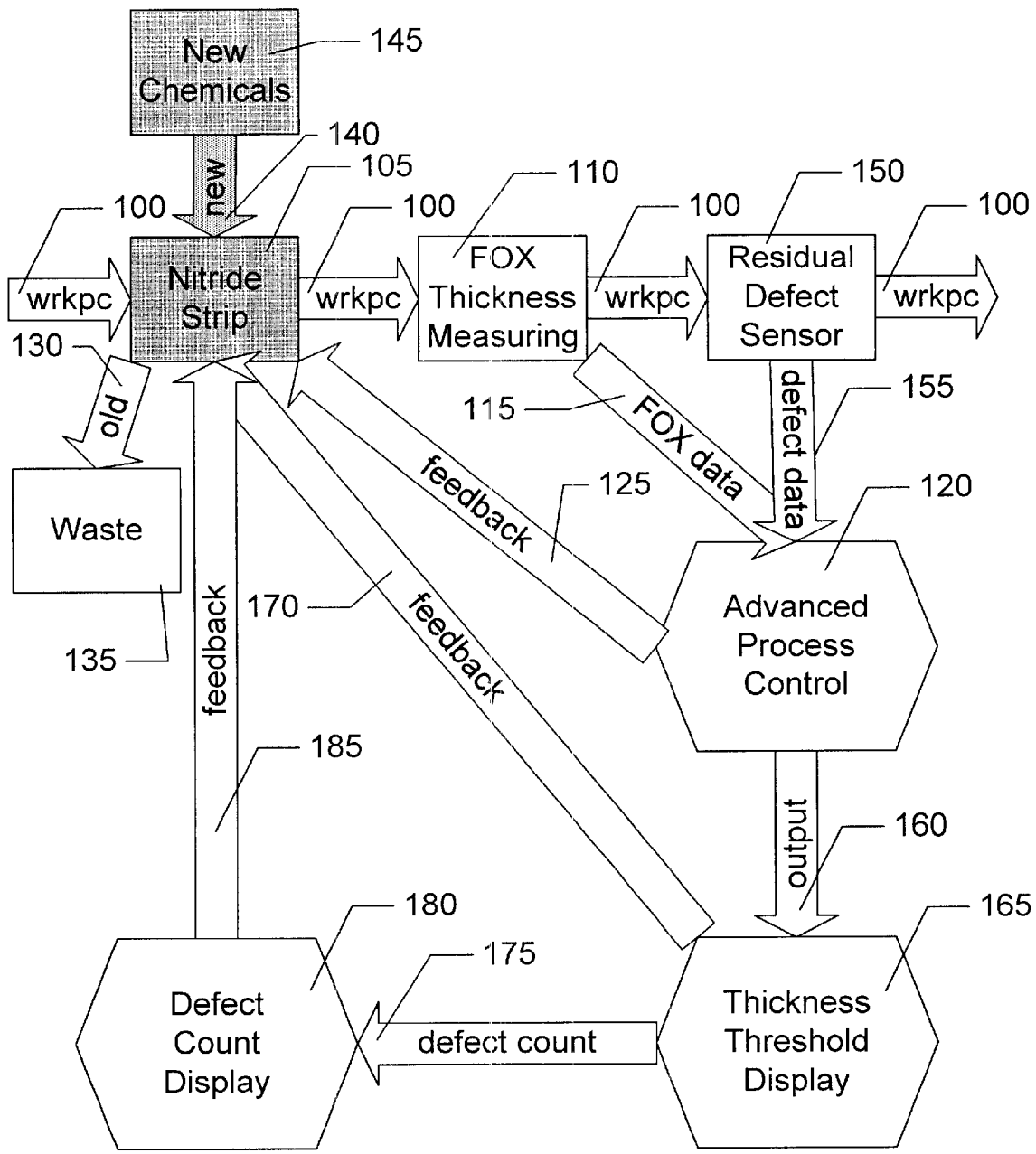

As shown in FIG. 8, another response to the feedback control signal 125 sent from the APC system monitor/controller 120 to the nitride processing step 105 may be to add new chemicals 140 to the chemical bath (not shown) used in the nitride processing step 105 from a new chemical supply 145. By adding the new chemicals 140 to the chemical bath (not shown) from the new chemical supply 145, the concentration of silicon (Si) may also be reduced, for example. In another illustrative embodiment, the concentration of Si after the new chemicals 140 have been added from the new chemical supply 145 may be in a range of approximately 10–100 parts per billion (ppb).

Figure 9:
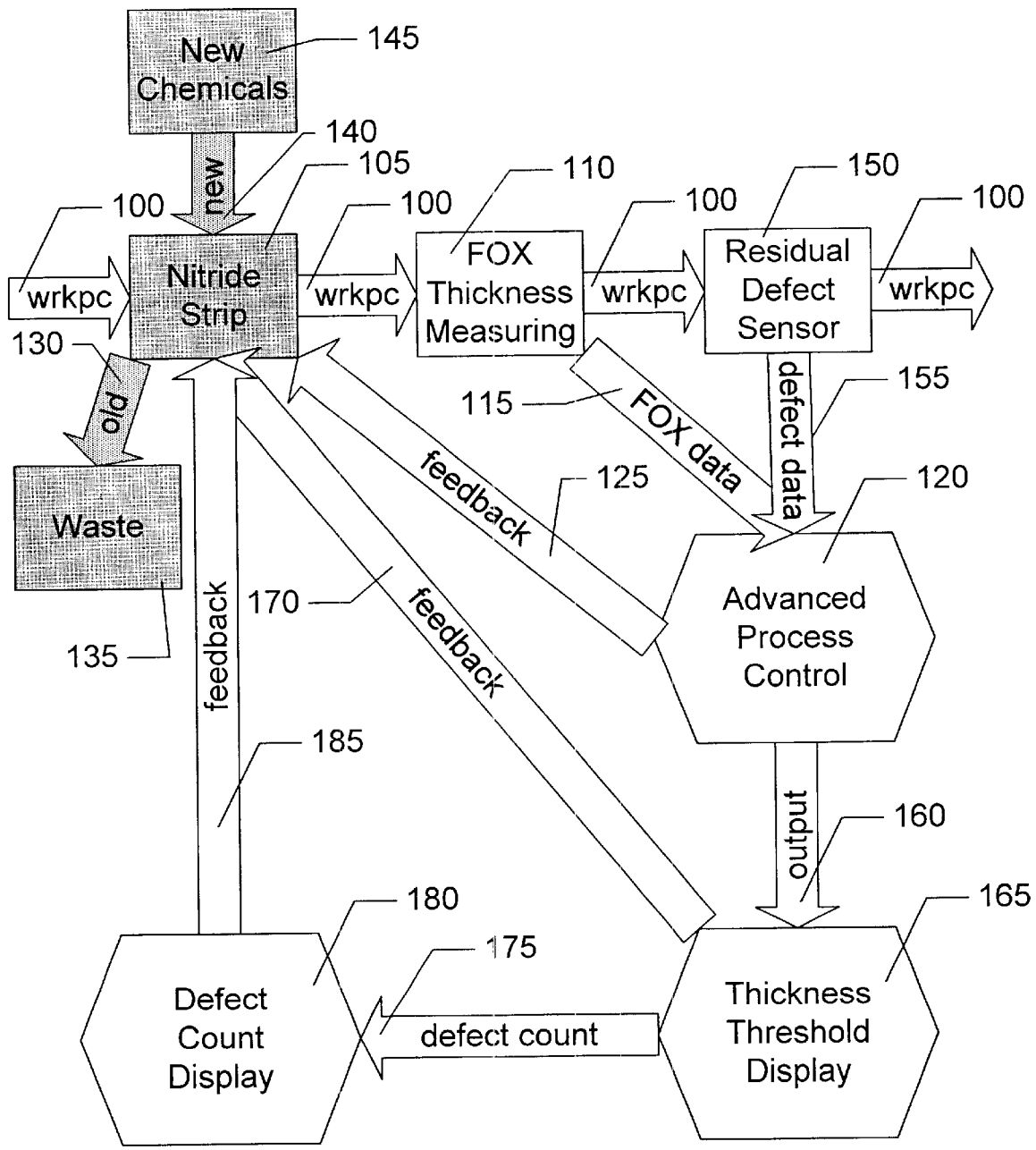

As shown in FIG. 9, yet another response to the feedback control signal 125 sent from the APC system monitor/controller 120 to the nitride processing step 105 may be to add the new chemicals 140 to the chemical bath (not shown) from the new chemical supply 145, and, if the chemical bath is substantially fill, also to drain the old portion 130 of the chemical bath (not shown) used in the nitride processing step 105 into the waste outlet 135. By adding the new chemicals 140 to the chemical bath (not shown) from the new chemical supply 145, and, if the chemical bath is substantially full, draining the old portion 130 of the chemical bath (not shown) into the waste outlet 135, the overall concentration of silicon (Si) may be reduced, for example. In yet another illustrative embodiment, the concentration of Si after the new chemicals 140 have been added from the new chemical supply 145 and, if the chemical bath is substantially full, after the old portion 130 has been drained into the waste outlet 135, may be in a range of approximately 10–100 parts per billion (ppb).

The APC system monitor/controller 120 may be a preferred platform used in various illustrative embodiments of the present invention. In various illustrative embodiments, the APC system monitor/controller 120 may be part of a factory-wide software system. The APC system monitor/controller 120 also allows remote access and monitoring of the process performance. Furthermore, by utilizing the APC system monitor/controller 120, data storage can be more convenient, more flexible, and less expensive than local data storage on local drives, for example. The APC system monitor/controller 120 allows for more sophisticated types of control because it provides a significant amount of flexibility in writing the necessary software code.

Deployment of the control strategies used in various illustrative embodiments of the present invention onto the APC system monitor/controller 120 may require a number of software components. In addition to components within the APC system monitor/controller 120, a computer script may be written for each of the semiconductor manufacturing tools involved in the control system. When a semiconductor manufacturing tool in the control system is started in the semiconductor manufacturing fab, the semiconductor manufacturing tool may call upon a script to initiate the action that is required by a nitride processing step controller (not shown). The control methods are generally defined and performed in these scripts. The development of these scripts may involve a substantial portion of the development of a control system. Various illustrative embodiments using an APC system for implementing nitride strip/etching processing are described below in conjunction with FIGS. 22–26.

Figure 10:
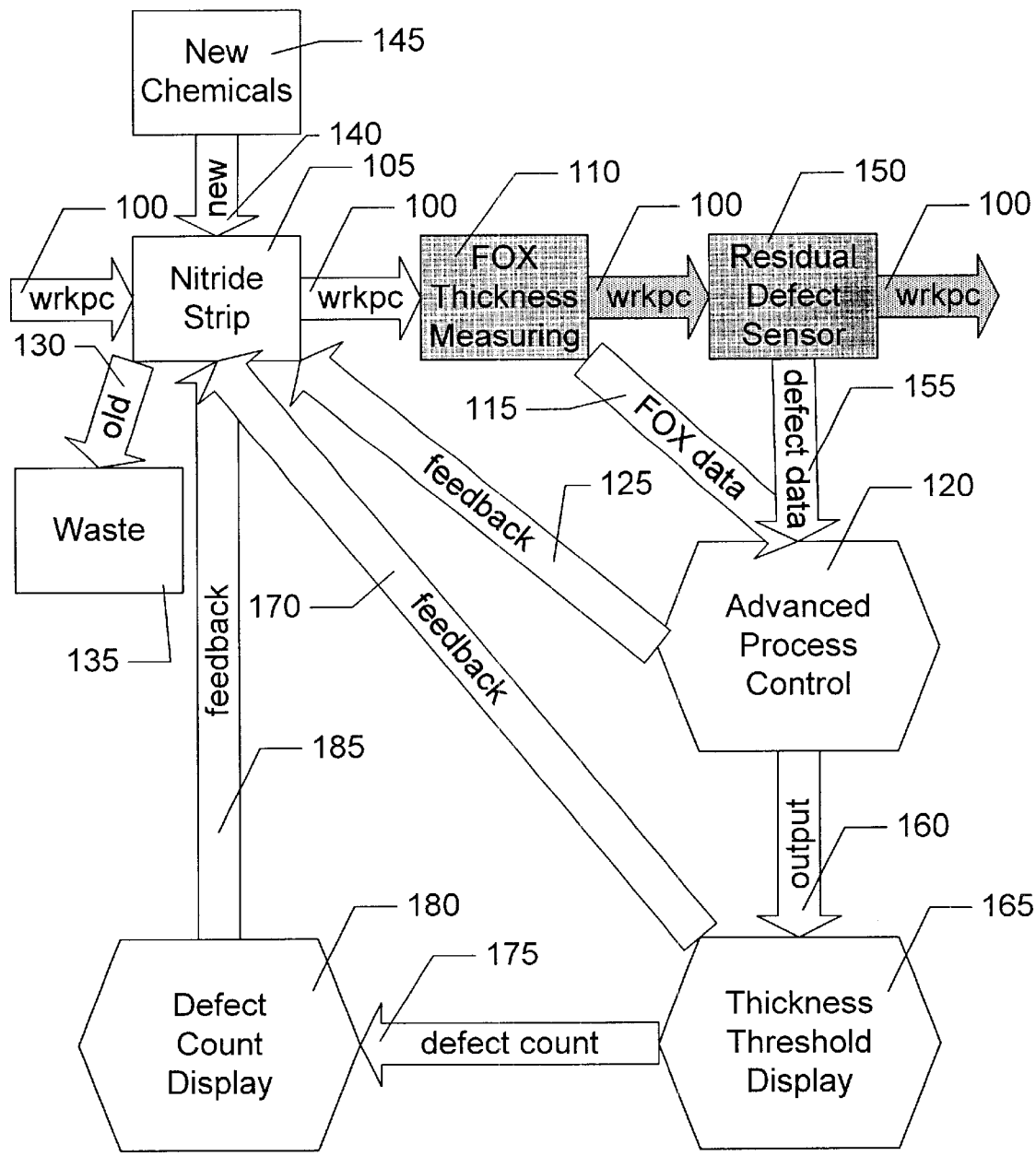

As shown in FIG. 10, the workpiece 100 is sent from the FOX thickness measuring step 110 to a residual FOX defect sensor 150. In the residual FOX defect sensor 150, residual FOX defects may be detected, generating a residual FOX defect count 155. The workpiece 100 may be sent from the residual FOX defect sensor 150 for further processing and/or handling.

Figure 11:
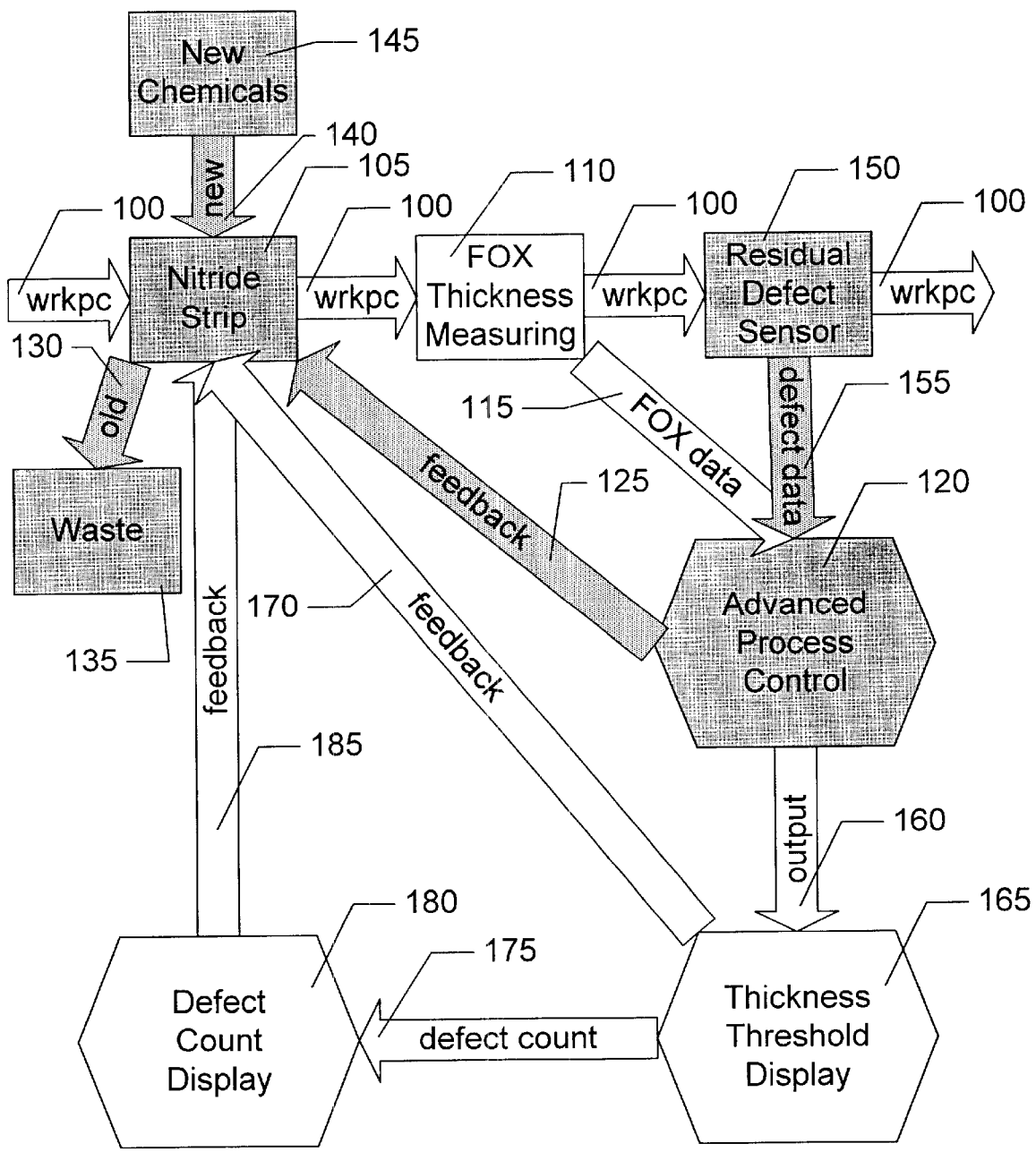

As shown in FIG. 11, the residual FOX defect count 155 is sent from the residual FOX defect sensor 150 to the APC system monitor/controller 120. In the APC system monitor/controller 120, the residual FOX defect count 155 may be used to monitor and control the processing taking place in the nitride processing step 105. In one illustrative embodiment, the APC system monitor/controller 120 may use the residual FOX defect count 155 to send a feedback control signal 125 to the nitride processing step 105. In another illustrative embodiment, the APC system monitor/controller 120 may use both the residual FOX defect count 155 (sent from the FOX defect sensor 150) and the FOX data 115 (sent from the FOX thickness measuring step 110) to send a feedback control signal 125 to the nitride processing step 105.

As shown in FIG. 11, the response to the feedback control signal 125 sent from the APC system monitor/controller 120 to the nitride processing step 105 may be to add the new chemicals 140 to the chemical bath (not shown) from the new chemical supply 145, and, if the chemical bath is substantially full, also to drain the old portion 130 of the chemical bath (not shown) used in the nitride processing step 105 into the waste outlet 135. By adding the new chemicals 140 to the chemical bath (not shown) from the new chemical supply 145, and, if the chemical bath is substantially full, draining the old portion 130 of the chemical bath (not shown) into the waste outlet 135, the overall concentration of silicon (Si) may be reduced, for example. In one illustrative embodiment, the concentration of Si after the new chemicals 140 have been added from the new chemical supply 145 and, if the chemical bath is substantially full, after the old portion 130 has been drained into the waste outlet 135, may be in a range of approximately 10–100 parts per billion (ppb).

Figure 12:
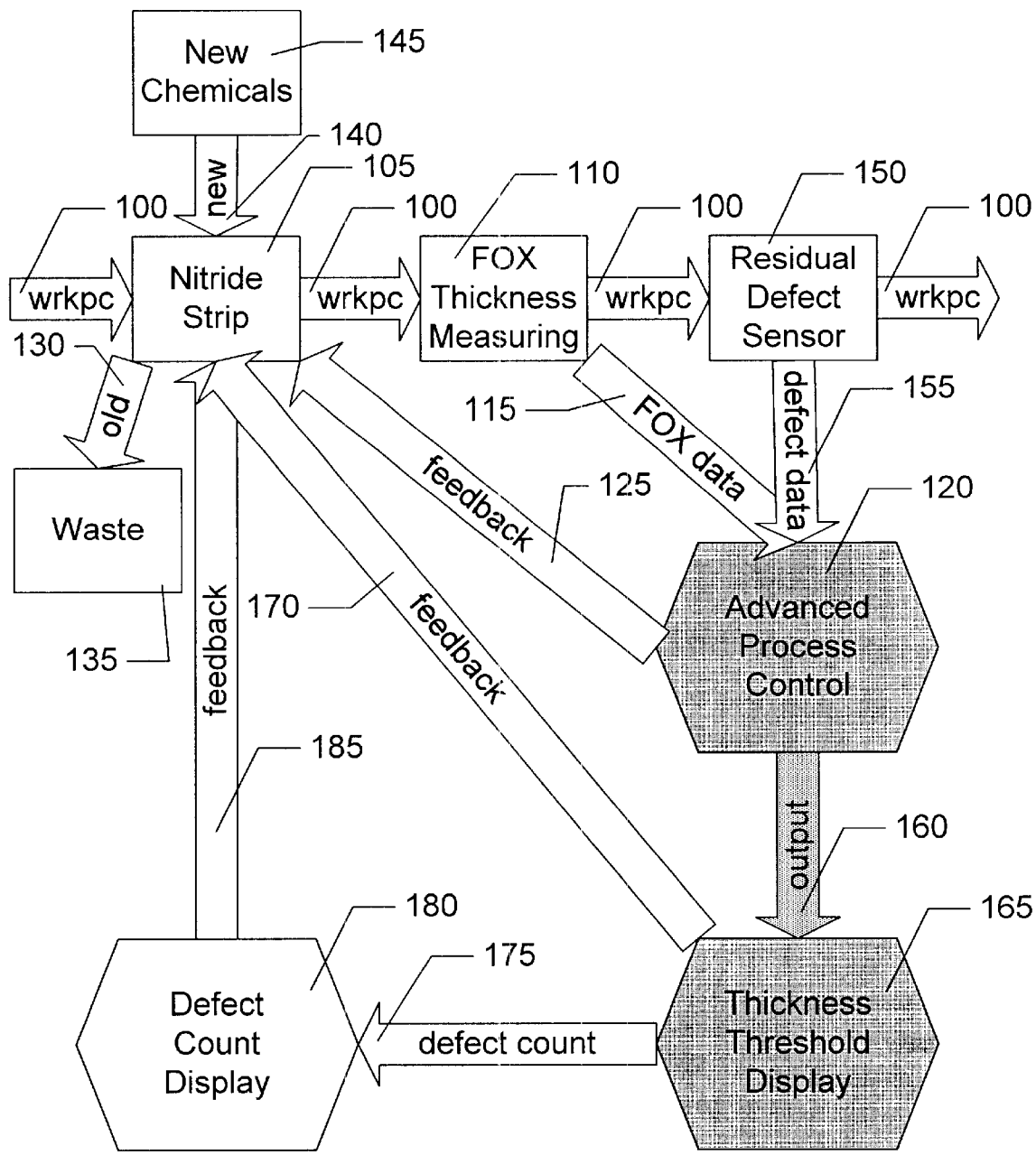
Figure 13:
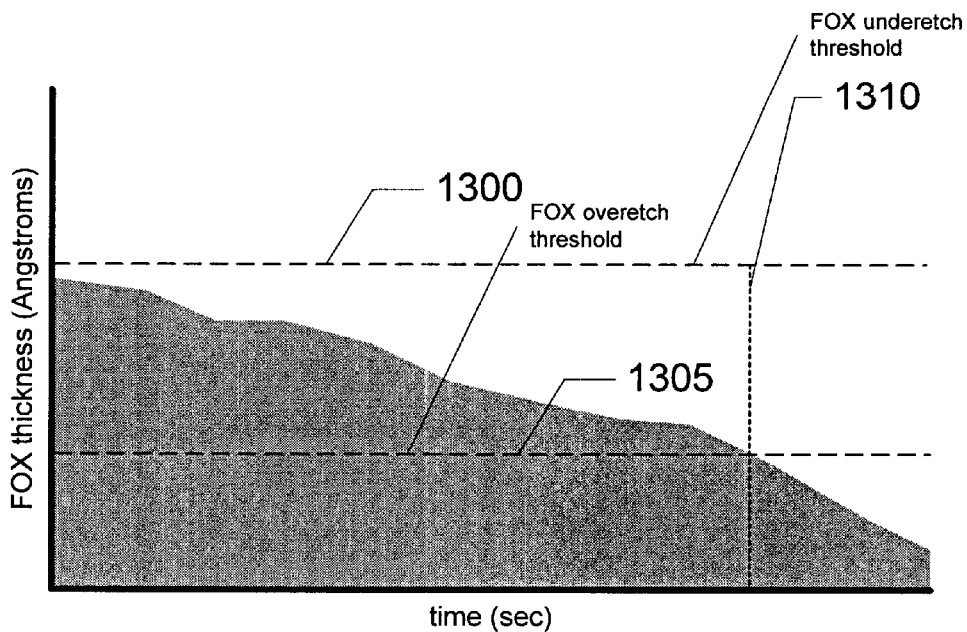

As shown in FIG. 12, in addition to, and/or instead of, the feedback control signal 125, output data 160 may be sent from the APC system monitor/controller 120 to a FOX thickness threshold data display step 165. In the FOX thickness threshold data display step 165, the output signal 160 may be displayed, for example, by being presented in the form of a graph, as illustrated in FIG. 13, showing the FOX thickness (measured in angstroms, Å) on the workpiece 100 plotted as a function of time (measured in seconds). In one illustrative embodiment, the FOX thickness displayed is the thickness t of the FOX feature 300 formed on the workpiece 100. In another illustrative embodiment, the FOX thickness displayed is the median $t_{median}$ and/or average thickness $t_{average}$ of the thickness values $t_1, t_2, \ldots, t_m$, where m is the total number of the FOX features (similar to the FOX features 400A, 405A and 410A in FIG. 4A) formed on the workpiece 100.

As shown in FIG. 13, in one illustrative embodiment, the FOX thickness may be between the FOX underetch threshold 1300 (shown in dashed phantom) and the FOX overetch threshold 1305 (shown in dashed phantom) for a period of time. The FOX thickness may eventually cross the FOX overetch threshold 1305 (shown in dashed phantom) at the time 1310 (shown in dotted phantom).

The display of the FOX thickness in the FOX thickness threshold data display step 165 may be used to alert an engineer of the need to adjust the processing performed in the nitride processing step 105 to reduce the overall concentration of nitride, for example. The engineer may also adjust, for example, the FOX underetch threshold 1300 (shown in dashed phantom) and the FOX overetch threshold 1305 (shown in dashed phantom).

Figure 14:
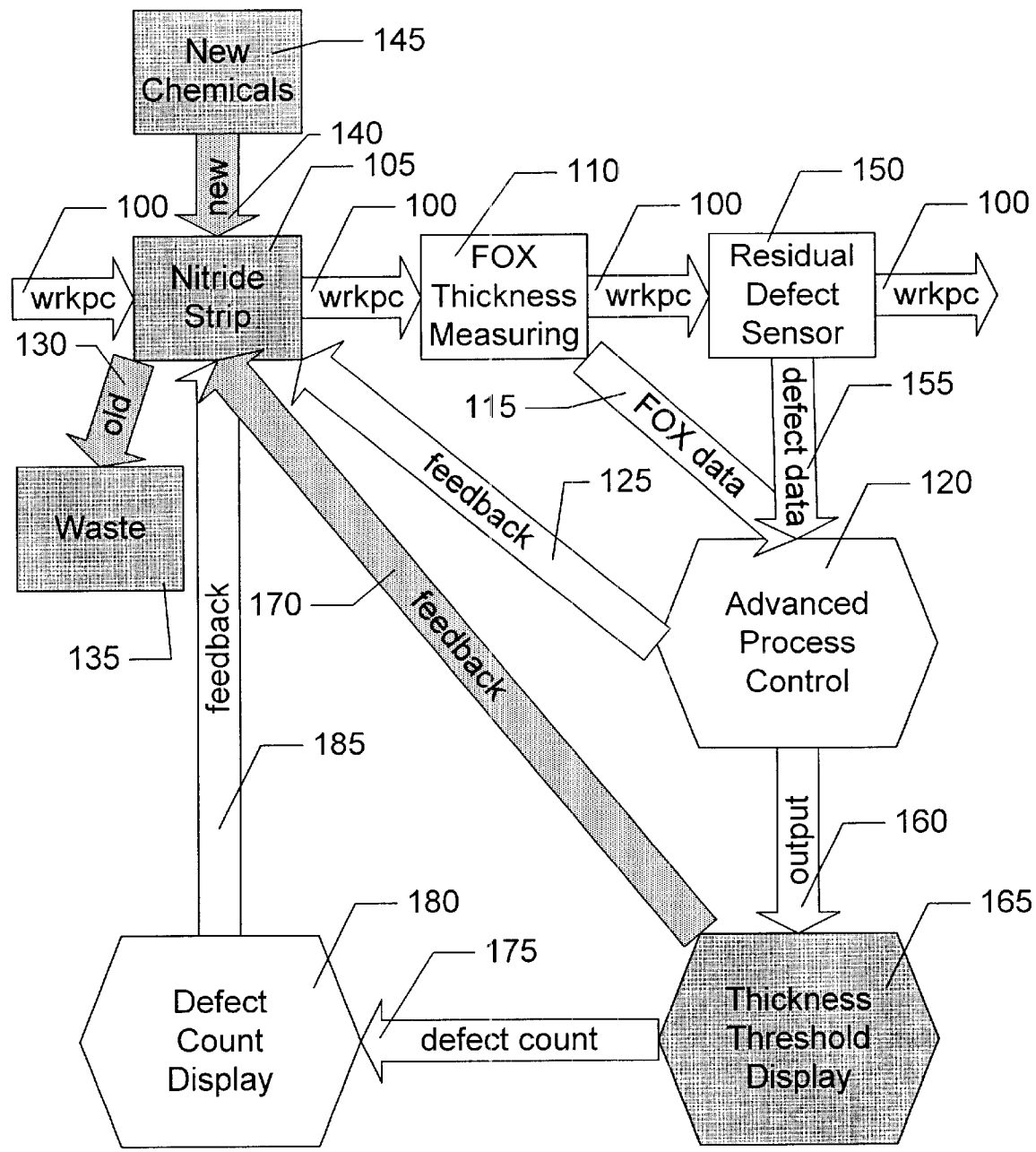

As shown in FIG. 14, a feedback control signal 170 may be sent from the FOX thickness threshold data display step 165 to the nitride processing step 105. As shown in FIG. 14, the response to the feedback control signal 170 sent from the FOX thickness threshold data display step 165 to the nitride processing step 105 may be to add the new chemicals 140 to the chemical bath (not shown) from the new chemical supply 145, and, if the chemical bath is substantially full, also to drain the old portion 130 of the chemical bath (not shown) used in the nitride processing step 105 into the waste outlet 135. By adding the new chemicals 140 to the chemical bath (not shown) from the new chemical supply 145, and, if the chemical bath is substantially full, draining the old portion 130 of the chemical bath (not shown) into the waste outlet 135, the overall concentration of silicon (Si) may be reduced, for example. In one illustrative embodiment, the concentration of Si after the new chemicals 140 have been added from the new chemical supply 145 and, if the chemical bath is substantially full, after the old portion 130 has been drained into the waste outlet 135, may be in a range of approximately 10–100 parts per billion (ppb).

Figure 16:
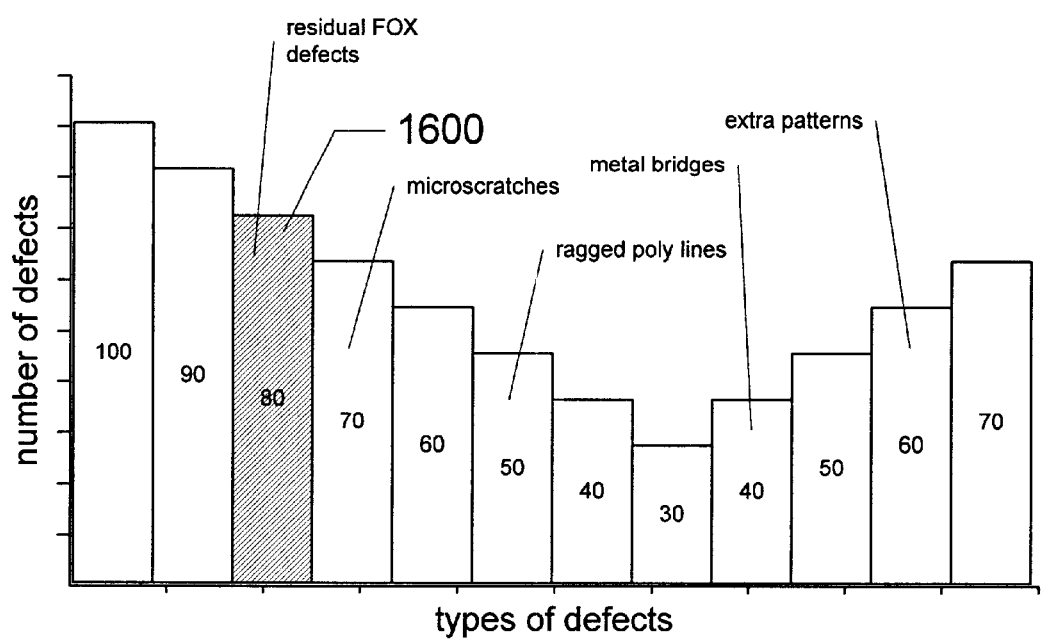
Figure 15:
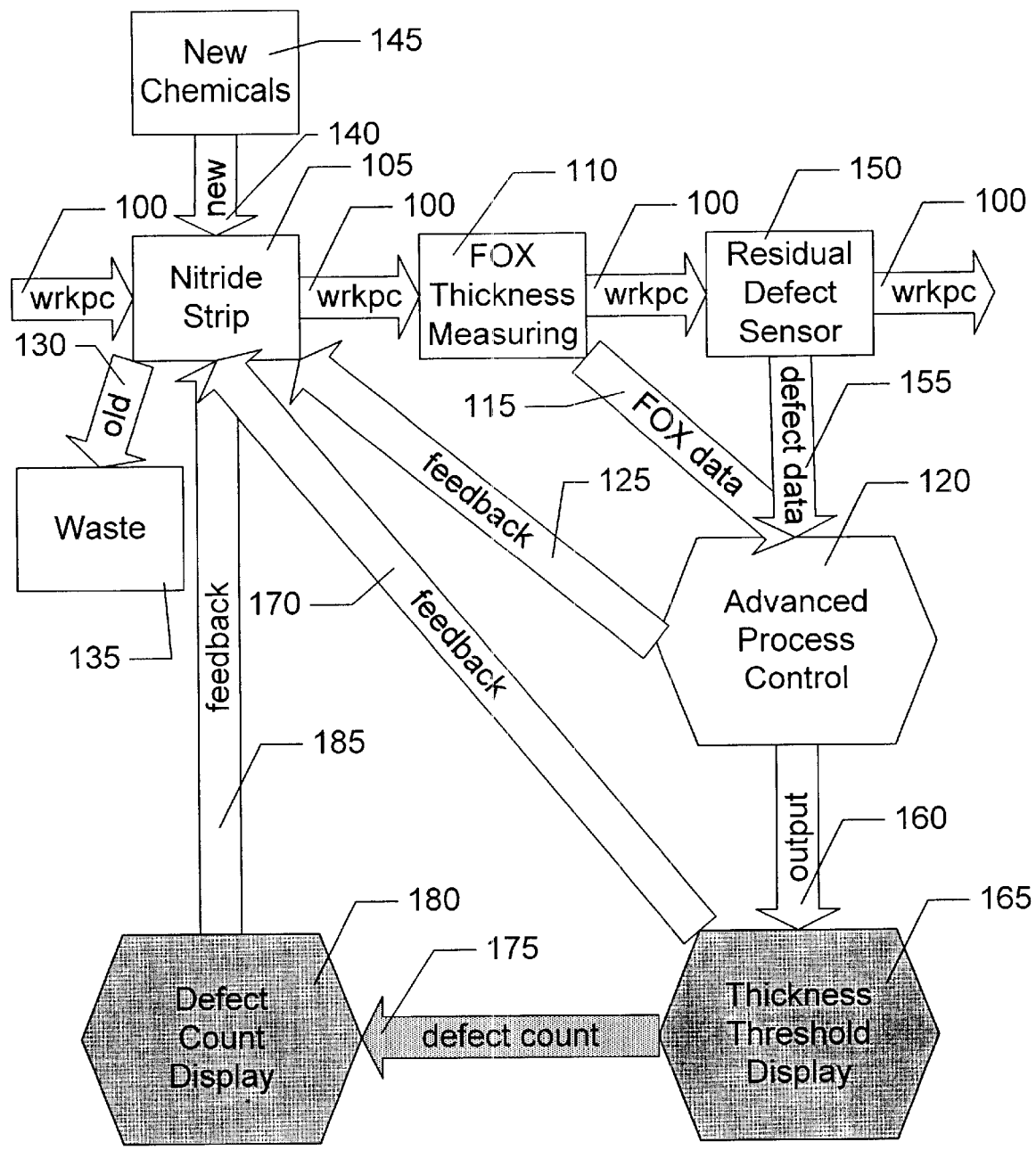
Figure 17:
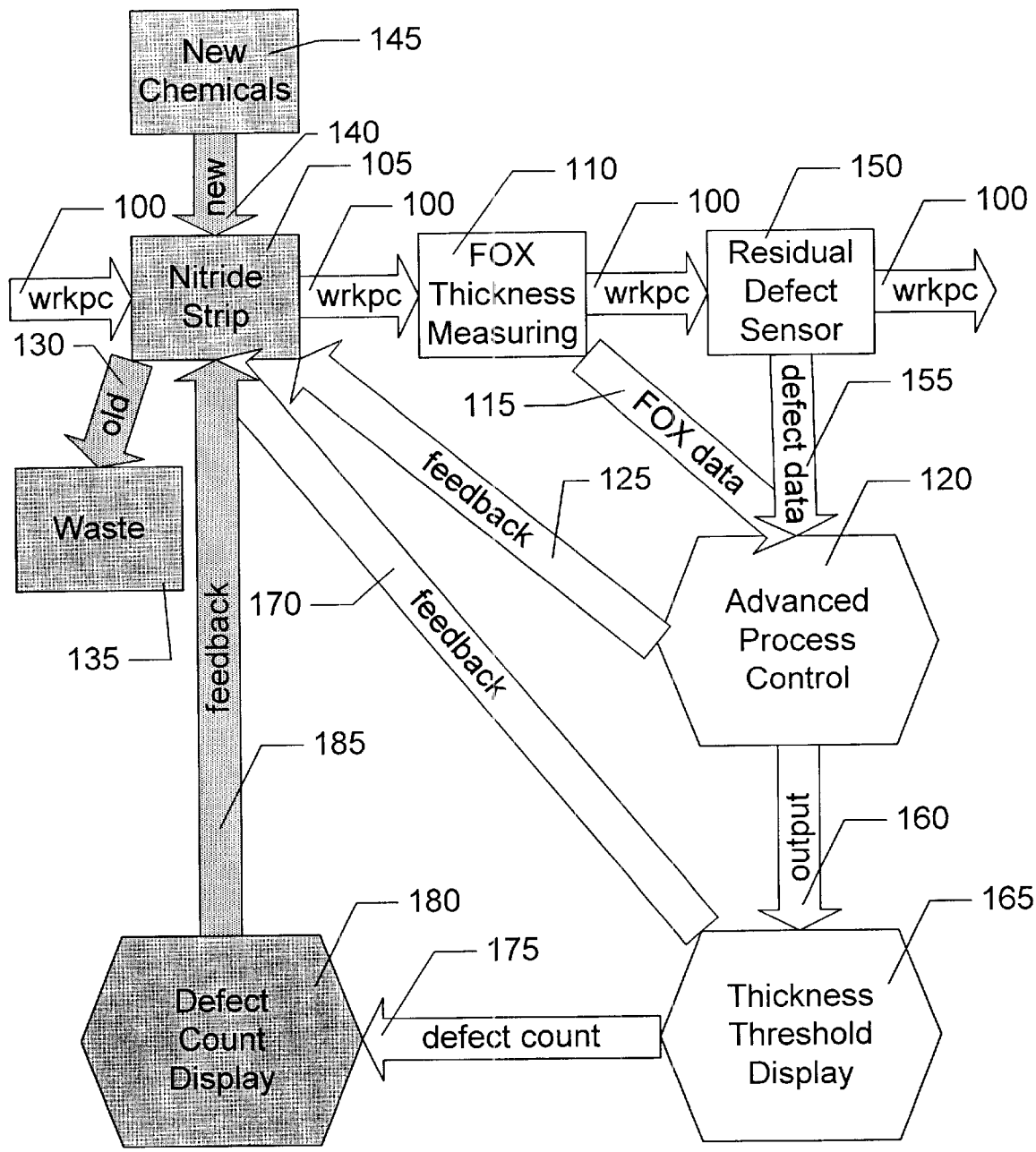

As shown in FIG. 15, in addition to, and/or instead of, the feedback control signal 170, defect counts 175 may be sent from the FOX thickness threshold data display step 165 to a defect count display step 180. In the defect count display step 180, the defect counts 175 may be displayed, for example, by being presented in the form of a histogram, as illustrated in FIG. 16, showing both the count number (defect counts 175) and the types of defects represented by the output signal 160. As shown in FIG. 16, in one illustrative embodiment, the number of residual FOX defects (shown shaded at 1600) is about 80, in the locations scanned, for the duration of the scan.

The display of the number of residual FOX defects in the defect count display step 180 may be used to alert an engineer of the need to adjust the processing performed in the nitride processing step 105 to reduce the overall concentration of nitride, for example. The engineer may also alter and/or select, for example, the type of residual FOX defect whose defect counts 175 are to be displayed in the defect count display step 180.

As shown in FIG. 16, a feedback control signal 185 may be sent from the defect count display step 180 to the nitride processing step 105. As shown in FIG. 16, the response to the feedback control signal 185 sent from the defect count display step 180 to the nitride processing step 105 may be to add the new chemicals 140 to the chemical bath (not shown) from the new chemical supply 145, and, if the chemical bath is substantially full, also to drain the old portion 130 of the chemical bath (not shown) used in the nitride processing step 105 into the waste outlet 135. By adding the new chemicals 140 to the chemical bath (not shown) from the new chemical supply 145, and, if the chemical bath is substantially full, draining the old portion 130 of the chemical bath (not shown) into the waste outlet 135, the overall concentration of silicon (Si) may be reduced, for example. In one illustrative embodiment, the concentration of Si after the new chemicals 140 have been added from the new chemical supply 145 and, if the chemical bath is substantially full, after the old portion 130 has been drained into the waste outlet 135, may be in a range of approximately 10–100 parts per billion (ppb).

In one illustrative embodiment, in both the FOX thickness threshold data display step 165 and the defect count display step 180, and/or by using the APC system monitor/controller 120, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 18:
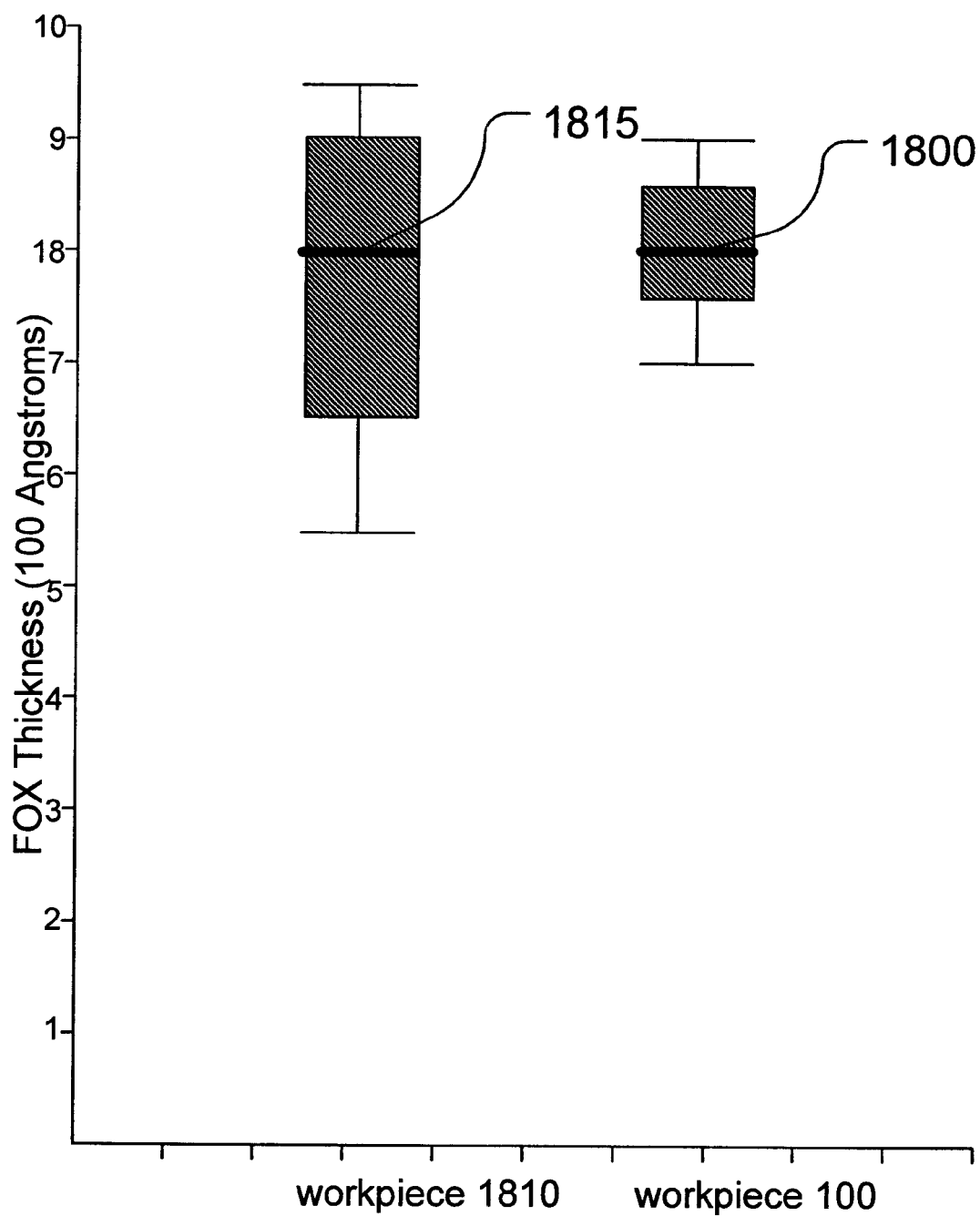

As shown in FIG. 18, in various illustrative embodiments, the FOX thickness may be the median $t_{median}$ of the thickness values $t_1i, t_2, \ldots, t_m$, where m is the total number of the FOX features (similar to the FOX features 400A, 405A and 410A in FIG. 4A) formed on the workpiece 100. For example, as shown in FIG. 18, using a Tukey "box and whiskers" plot, the FOX thickness measurements performed on the FOX features 400A, 405A and 410A (see FIG. 4A) formed on the workpiece 100 may have a median value 1800 of approximately 800 Å. The median value 1800 of the FOX thickness measurements is the sample value at the midpoint of the FOX thickness measurements, so that half of the FOX thickness measurement values are less than or equal to the median value 1800 and half of the FOX thickness measurement values are greater than or equal to the median value 1800.

As shown in FIG. 18, Tukey box and whiskers plots may be used to compare the FOX thickness measurement values taken using the FOX features 400A, 405A and 410A (see FIG. 4A) formed on the workpiece 100 with FOX thickness measurement values taken using FOX features (not shown) formed on a workpiece 1810 (not shown), similar to the FOX features 400A, 405A and 410A (see FIG. 4A) formed on the workpiece 100, for example. The median value 1815 is approximately 800 Å for the FOX thickness measurements of the FOX features (not shown) formed on the workpiece 1810 (not shown), similar to the FOX features 400A, 405A and 410A (see FIG. 4A) formed on the workpiece 100.

Figure 19:
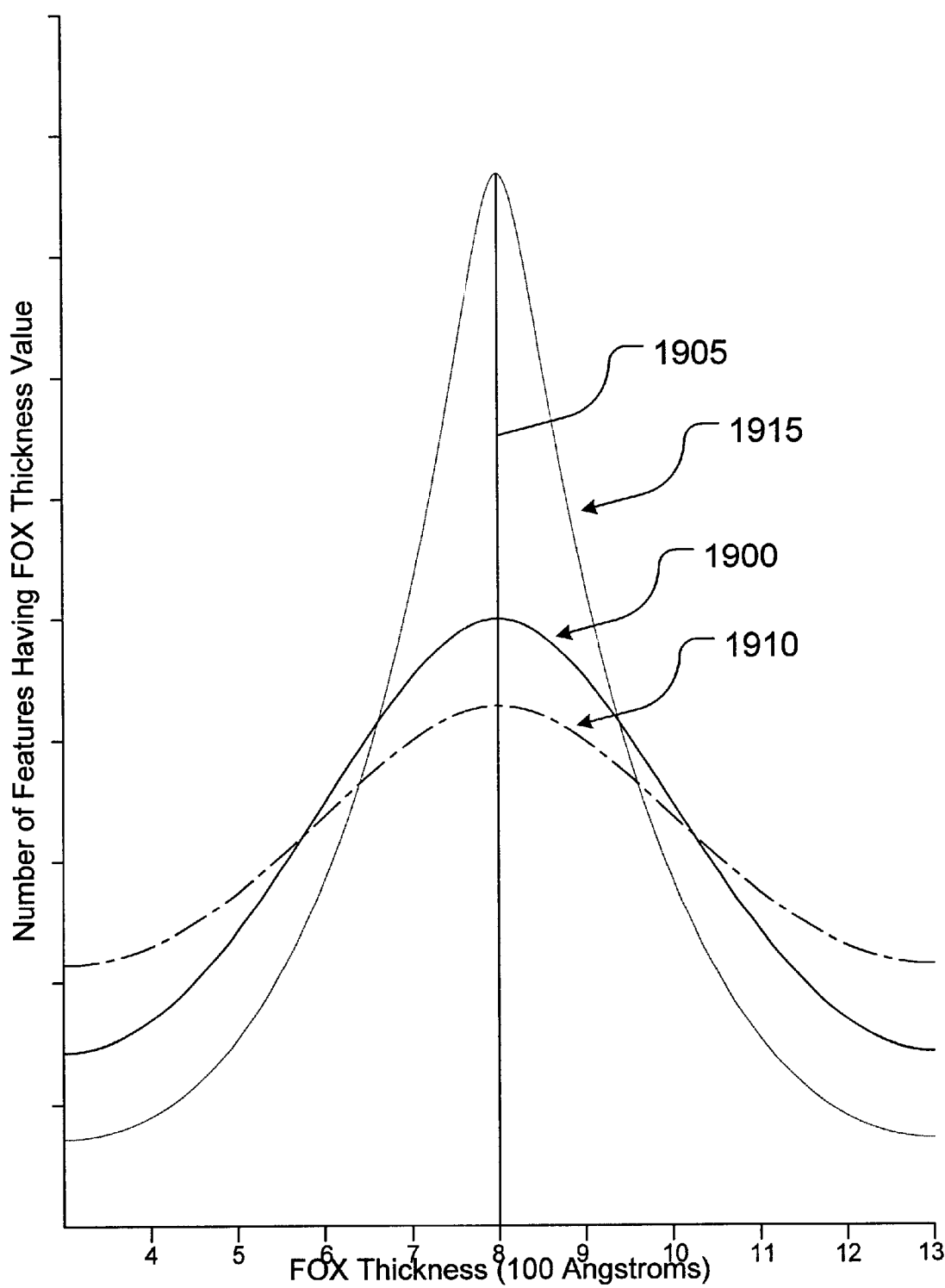

Alternatively, the FOX thickness may be the average thickness $t_{average}$ of the thickness values $t_1, t_2, \ldots, t_m$, where m is the total number of the FOX features (similar to the FOX features 400A, 405A and 410A in FIG. 4A) formed on the workpiece 100. As shown in FIG. 19, using a Student's t-distribution plot 1900, the FOX thickness measurement values taken using the FOX features 400A, 405A and 410A (see FIG. 4A) formed on the workpiece 100 may have a sample mean value 1905 of approximately 800 Å. The sample mean value 1905 of the FOX thickness measurements taken using FOX features 400A, 405A and 410A (see FIG. 4A) is the sample average $$\bar{x} = \frac{1}{m}\sum_{i=1}^{m} x_i$$

of the FOX thickness measurements over all m of the features 400A, 405A and 410A that are measured, where $x_i$ is the FOX thickness measurement of the ith of the features 400A, 405A and 410A. Note that the number m of the features 400A, 405A and 410A that are measured may be less than or equal to the total number M of the features 400A, 405A and 410A on the workpiece 100.

As shown in FIG. 19, Student's t-distribution plots 1900 and 1910 may be used to compare the sample mean value 1905 of the FOX thickness measurements (performed on the workpiece 100) with the sample mean value 1905 of the FOX thickness measurements performed on the workpiece 1810 (not shown), for example. The sample mean value 1905 of approximately 800 Å of the FOX thickness measurements performed on the workpiece 1810 (not shown) is the sample average $$\bar{y} = \frac{1}{n}\sum_{j=1}^{n} y_j$$

of the FOX thickness measurements over all n of the features (not shown) that are measured on the workpiece 1810 (not shown), where $y_j$ is the FOX thickness measurement of the jth of the features (not shown) that are measured on the workpiece 1810 (not shown). Note that the number n of the features (not shown) that are measured on the workpiece 1810 (not shown) may be less than or equal to the total number T of the features (not shown) that are measured on the workpiece 1810 (not shown).

As shown in FIG. 19, the Student's t-distribution plots 1900 and 1910 may approach the Gaussian normal z-distribution plot 1915 as the number of features n and m becomes very large, for m>n>>about 25. The Gaussian normal z-distribution plot 1915 has the mean value 1905 ($\mu$) given by the expressions $$\mu = \left\langle \frac{1}{m}\sum_{i=1}^{m} x_i \right\rangle = \frac{1}{m}\sum_{i=1}^{m} \langle x_i \rangle = \frac{1}{m}\sum_{i=1}^{m} \mu = \frac{m}{m}\mu \text{ and}$$

$$\mu = \left\langle \frac{1}{n}\sum_{j=1}^{n} y_j \right\rangle = \frac{1}{n}\sum_{j=1}^{n} \langle y_j \rangle = \frac{1}{n}\sum_{j=1}^{n} \mu = \frac{n}{n}\mu,$$

in the limit m>n>>about 25, where $x_i$ (the FOX thickness measurement of the ith of the features on the workpiece 100) and $y_j$ (the FOX thickness measurement of the jth of the features on the workpiece 1810) are treated as independent random variables with means $\langle x_i \rangle = \mu = \langle y_j \rangle$ for $1 \leq i \leq m$ and $1 \leq j \leq n$, and where the mean value 1905 ($\mu$) may also be approximately 800 Å.

Figure 20:
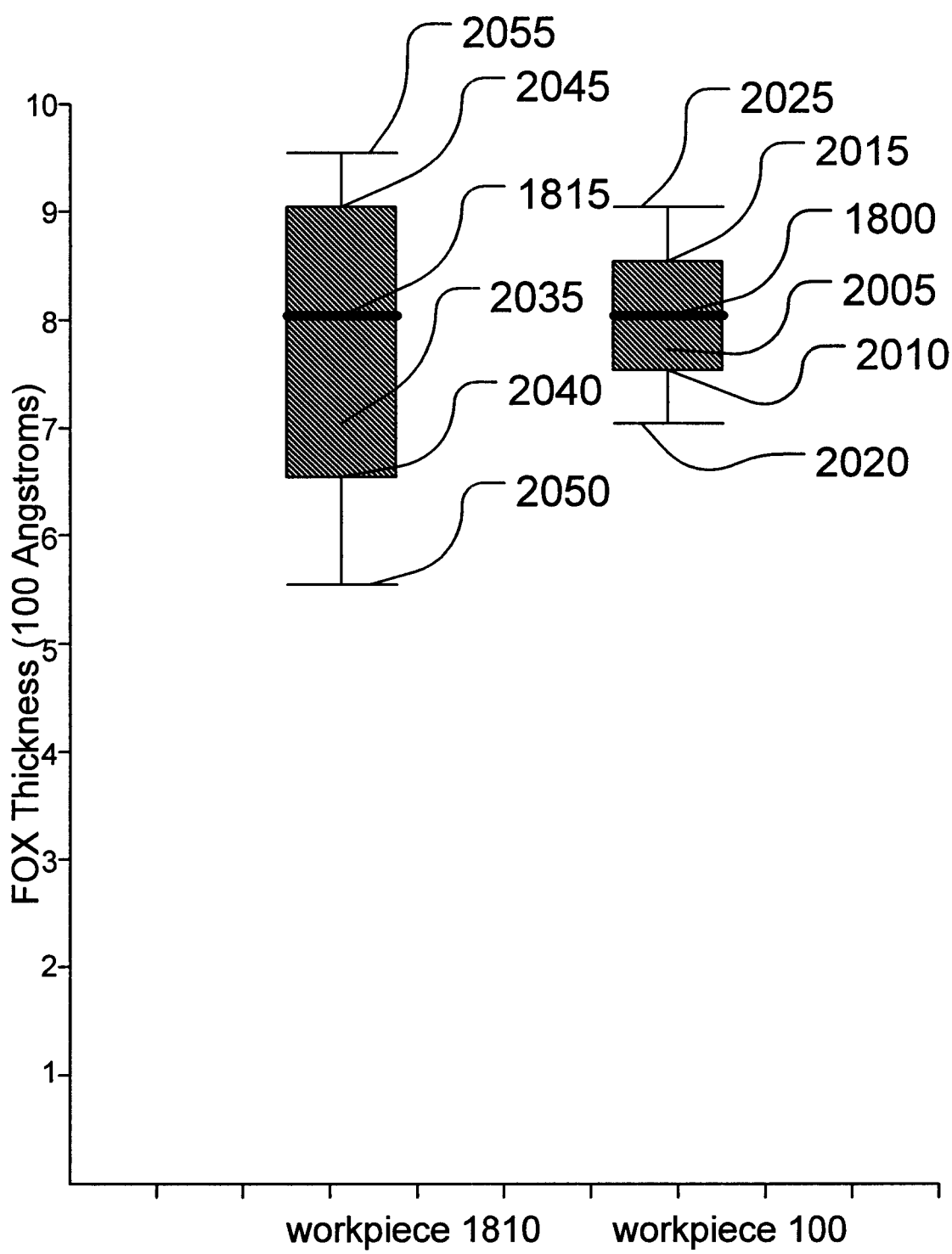

As shown in FIG. 20, using a Tukey "box and whiskers" plot, the FOX thickness measurements performed on the workpiece 100 may have the median value 1800 (see FIG. 18) contained within an interquartile range (IQR) box 2005 bounded by first and third quartile values 2010 and 2015, respectively. Whiskers 2020 and 2025 may not extend beyond one and a half times the difference between the third and first quartiles 2015 and 2010 (1.5×IQR).

The first quartile value 2010 is the median value of the FOX thickness measurements that are less than or equal to the median value 1800. The third quartile value 2015 is the median value of the FOX thickness measurements that are greater than or equal to the median value 1800. The IQR is the difference between the third and first quartiles 2015 and 2010. Any FOX thickness measurement values beyond the whiskers 2020 and 2025 are "outliers" and may not always be depicted in a Tukey box and whiskers plot.

As shown in FIG. 20, Tukey box and whiskers plots may be used to compare the FOX thickness measurement values taken on the workpiece 100 with the FOX thickness measurement values taken on the workpiece 1810 (not shown), for example. The FOX thickness measurements performed on the workpiece 1810 may have the median value 1815 (see FIG. 18) contained within an IQR box 2035 bounded by first and third quartile values 2040 and 2045, respectively. Whiskers 2050 and 2055 may not extend beyond one and a half times the difference between the third and first quartiles 2045 and 2040 (1.5×IQR).

The first quartile value 2040 is the median value of the FOX thickness measurements that are less than or equal to the median value 1815. The third quartile value 2045 is the median value of the FOX thickness measurements that are greater than or equal to the median value 1815. The IQR is the difference between the third and first quartile values 2045 and 2040. Any FOX thickness measurement values beyond the whiskers 2050 and 2055 are "outliers" and may not always be depicted in a Tukey box and whiskers plot.

Figure 21:
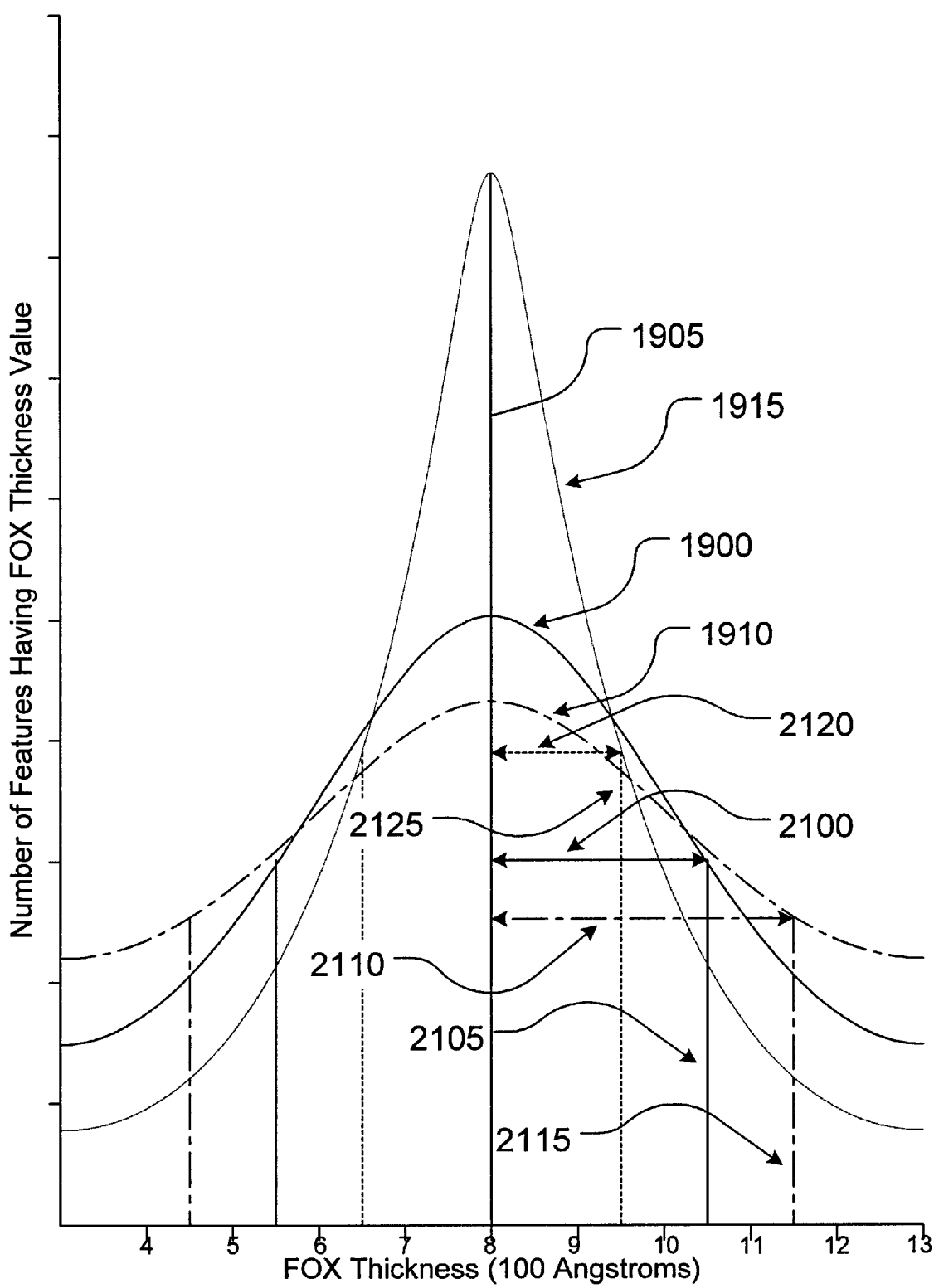

Alternatively, as shown in FIG. 21, using the Student's t-distribution plot 1900, the FOX thickness measurements performed on the workpiece 100 may have the sample mean value 1905 and a sample standard error 2100, bounded by the sample mean value 1905 and a first standard error line 2105. The sample standard error 2100 is $$SE(\bar{x}) = \frac{s}{\sqrt{m}} = \sqrt{\frac{1}{m(m-1)}\sum_{i=1}^{m}(x_i - \bar{x})^2},$$

where the sample standard deviation is $$s = \sqrt{\frac{1}{(m-1)}\sum_{i=1}^{m}(x_i - \bar{x})^2}$$

for the FOX thickness measurements taken over all m of the features that are measured on the workpiece 100, where $x_i$ is the FOX thickness measurement of the ith FOX feature. Note that the number m of the FOX features that are measured may be less than or equal to the total number M of the FOX features on the workpiece 100. The sample standard error 2100 for the FOX thickness measurements decreases as the number m (the number of the FOX features on the workpiece 100 that are measured) increases.

As shown in FIG. 21, Student's t-distribution plots 1900 and 1910 may be used to compare the FOX thickness measurement values taken on the workpiece 100 with the FOX thickness measurement values taken on the workpiece 1810 (not shown), for example. The FOX thickness measurements performed on the workpiece 1810 may have the sample mean value 1905 and a sample standard error 2110, bounded by the sample mean value 1905 and a first standard error line 2115. The sample standard error 2110 is $$SE(\bar{y}) = \frac{s}{\sqrt{n}} = \sqrt{\frac{1}{n(n-1)}\sum_{j=1}^{n}(y_j - \bar{y})^2}, \text{ where}$$

$$s = \sqrt{\frac{1}{(n-1)}\sum_{j=1}^{n}(y_j - \bar{y})^2}$$

for the FOX thickness measurements taken over all n of the FOX features that are measured on the workpiece 1810, where $y_j$ is the FOX thickness measurement of the jth FOX feature. Note that the number n of the FOX features that are measured on the workpiece 1810 may be less than or equal to the total number T of the FOX features on the workpiece 1810. The sample standard error 2110 for the FOX thickness measurements decreases as the number n (the number of the FOX features 820 on the workpiece 1810 that are measured) increases.

As shown in FIG. 21, the Student's t-distribution plots 1900 and 1910 may approach the Gaussian normal z-distribution plot 1915 as the number of features n and m becomes very large, for m>n>>about 25. The Gaussian normal z-distribution plot 1915 has a standard deviation 2120 ($\sigma/\sqrt{m}$), bounded by the mean value 1905 ($\mu$) and a first standard deviation line 2125. The Gaussian normal standard deviation 2120 ($\sigma/\sqrt{m}$) is given by the expression $$\frac{\sigma}{\sqrt{m}} = \left\langle \left(\sum_{i=1}^{m}\frac{x_i}{m} - \mu\right)^2 \right\rangle^{\frac{1}{2}} = \left\langle \sum_{i=1}^{m}\frac{(x_i-\mu)^2}{m^2} \right\rangle^{\frac{1}{2}}$$

$$= \frac{1}{m}\left[\sum_{i=1}^{m}\langle(x_i-\mu)^2\rangle\right]^{\frac{1}{2}} = \frac{1}{m}\left[\sum_{i=1}^{m}\sigma^2\right]^{\frac{1}{2}} = \frac{\sigma\sqrt{m}}{m}$$

that is substantially equivalent to the normal standard deviation $\sigma/(\sqrt{n})$ given by $$\frac{\sigma}{\sqrt{n}} = \left\langle \left(\sum_{j=1}^{n}\frac{y_j}{n} - \mu\right)^2 \right\rangle^{\frac{1}{2}} = \left\langle \sum_{j=1}^{n}\frac{(y_j-\mu)^2}{n^2} \right\rangle^{\frac{1}{2}}$$

$$= \frac{1}{n}\left[\sum_{j=1}^{n}\langle(y_j-\mu)^2\rangle\right]^{\frac{1}{2}} = \frac{1}{n}\left[\sum_{j=1}^{n}\sigma^2\right]^{\frac{1}{2}} = \frac{\sigma\sqrt{n}}{n}$$

in the limit m>n>>about 25, where $x_i$ (the FOX thickness measurement of the ith FOX feature on the workpiece 100) and $y_j$ (the FOX thickness measurement of the jth FOX feature on the workpiece 1810) are treated as independent random variables with means $\langle x_i \rangle = \mu = \langle y_j \rangle$ and with variances $\langle (x_i-\mu)^2 \rangle = \sigma^2 = \langle (y_j-\mu)^2 \rangle$ for $1 \leq i \leq m$ and $1 \leq j \leq n$, and where the standard deviation 2120 ($\sigma/\sqrt{m}$) may be approximately 150 Å and may also be substantially equivalent to the normal standard deviation $\sigma/(\sqrt{n})$. Note that the independence means that $$\left\langle \left(\sum_{i=1}^{m}\frac{x_i}{m} - \mu\right)^2 \right\rangle = \left\langle \sum_{i=1}^{m}\frac{(x_i-\mu)^2}{m^2} \right\rangle + 2\left\langle \sum_{j<i}\sum_{i=1}^{m}\frac{(x_i-\mu)(x_j-\mu)}{m^2} \right\rangle$$

and that $$\left\langle \sum_{j<i}\sum_{i=1}^{m}\frac{(x_i-\mu)(x_j-\mu)}{m^2} \right\rangle = \sum_{j<i}\sum_{i=1}^{m}\frac{\langle(x_i-\mu)(x_j-\mu)\rangle}{m^2}$$

$$= \sum_{j<i}\sum_{i=1}^{m}\frac{\langle(x_i-\mu)\rangle\langle(x_j-\mu)\rangle}{m^2} \text{ and that}$$

$$\sum_{j<i}\sum_{i=1}^{m}\frac{\langle(x_i-\mu)\rangle\langle(x_j-\mu)\rangle}{m^2} = \sum_{j<i}\sum_{i=1}^{m}\frac{(\langle x_i\rangle - \langle\mu\rangle)(\langle x_j\rangle - \langle\mu\rangle)}{m^2}$$

$$= \sum_{j<i}\sum_{i=1}^{m}\frac{(\mu-\mu)(\mu-\mu)}{m^2} = 0.$$

Similarly note that $$\left\langle \left(\sum_{j=1}^{n}\frac{y_j}{n} - \mu\right)^2 \right\rangle = \left\langle \sum_{j=1}^{n}\frac{(y_j-\mu)^2}{n^2} \right\rangle + 2\left\langle \sum_{i<j}\sum_{j=1}^{n}\frac{(y_i-\mu)(y_j-\mu)}{n^2} \right\rangle$$

and that $$\left\langle \sum_{i<j}\sum_{j=1}^{n}\frac{(y_i-\mu)(y_j-\mu)}{n^2} \right\rangle = \sum_{i<j}\sum_{j=1}^{n}\frac{\langle(y_i-\mu)(y_j-\mu)\rangle}{n^2}$$

$$= \sum_{i<j}\sum_{j=1}^{n}\frac{\langle(y_i-\mu)\rangle\langle(y_j-\mu)\rangle}{n^2}$$

and that

-continued $$\sum_{i<j}\sum_{j=1}^{n}\frac{\langle(y_i-\mu)\rangle\langle(y_j-\mu)\rangle}{n^2} = \sum_{i<j}\sum_{j=1}^{n}\frac{(\langle y_i\rangle-\langle\mu\rangle)(\langle y_j\rangle-\langle\mu\rangle)}{n^2}$$

$$= \sum_{i<j}\sum_{j=1}^{n}\frac{(\mu-\mu)(\mu-\mu)}{n^2} = 0.$$

Figure 22:
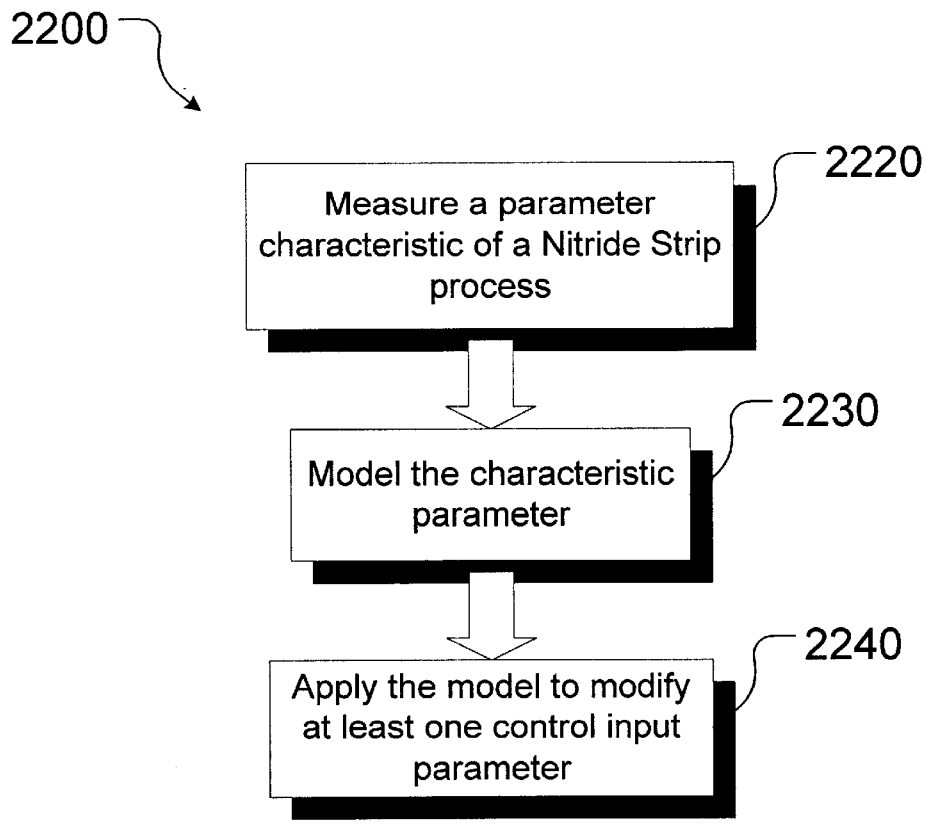
Figure 23:
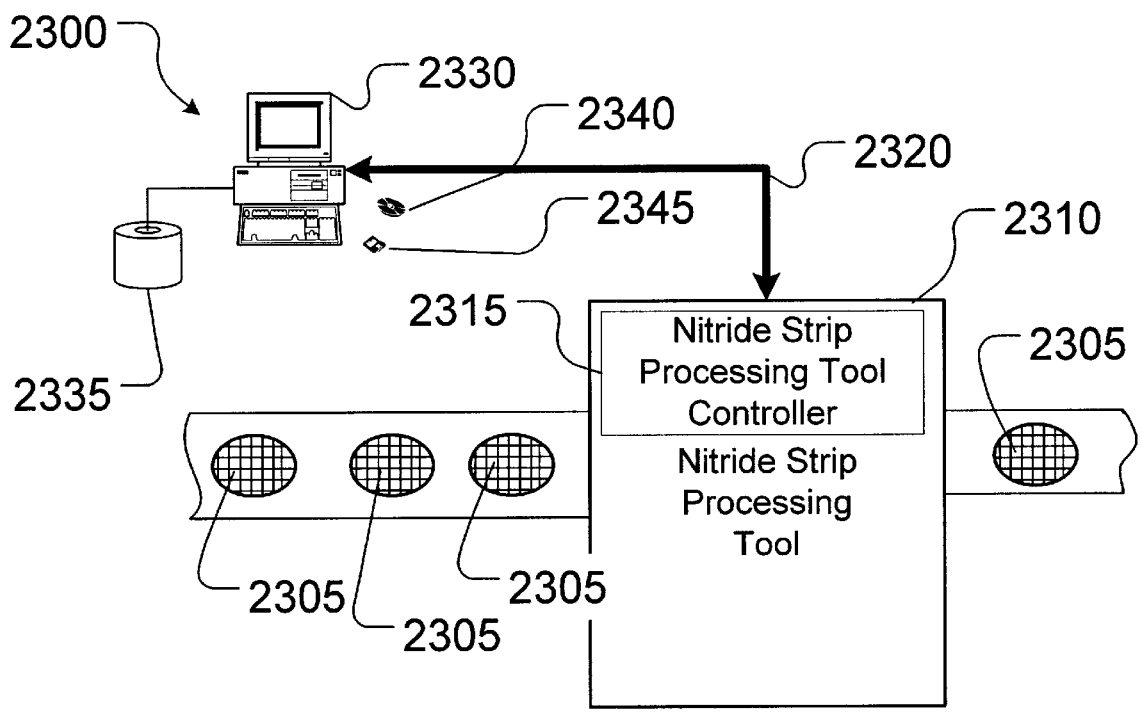

FIG. 22 illustrates one particular embodiment of a method 2200 practiced in accordance with the present invention. FIG. 23 illustrates one particular apparatus 2300 with which the method 2200 may be practiced. For the sake of clarity, and to further an understanding of the invention, the method 2200 shall be disclosed in the context of the apparatus 2300. However, the invention is not so limited and admits wide variation, as is discussed further below.

Referring now to both FIGS. 22 and 23, a batch or lot of workpieces or wafers 2305 is being processed through a nitride strip processing tool 2310. The nitride strip processing tool 2310 may be any nitride strip processing tool known to the art, provided it includes the requisite control capabilities. The nitride strip processing tool 2310 includes a nitride strip processing tool controller 2315 for this purpose. The nature and function of the nitride strip processing tool controller 2315 will be implementation specific. For instance, the nitride strip processing tool controller 2315 may control nitride strip control input parameters such as nitride stripping bath control input parameters. The nitride stripping bath control input parameters may include nitride strip control input parameters for adding hot aqueous phosphoric acid ($H_3PO_4$) to the bath used to selectively etch the silicon nitride ($Si_3N_4$), draining the bath, stirring the bath, and the like. Four workpieces 2305 are shown in FIG. 23, but the lot of workpieces or wafers, i.e., the "wafer lot," may be any practicable number of wafers from one to any finite number.

The method 2200 begins, as set forth in box 2220, by measuring a parameter characteristic of the nitride strip processing performed on the workpiece 2305 in the nitride strip processing tool 2310. The nature, identity, and measurement of characteristic parameters will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude. For example, a metrology tool (not shown) may the FOX thickness of a workpiece 2305, and/or an average of the FOX thicknesses of the workpieces 2305 in a lot, and the metrology tool may need to be calibrated, but this calibration may vary from wafer to wafer. The metrology tool by itself typically does not feed back the FOX thickness information to the nitride strip tool. The FOX thickness of a workpiece 2305, and/or an average of the FOX thicknesses of the workpieces 2305 in a lot, is an illustrative example of a parameter characteristic of the nitride strip processing performed on the workpiece in the nitride strip processing tool 2310. Another illustrative example of a parameter characteristic of the nitride strip processing performed on the workpiece in the nitride strip processing tool 2310 is the residual FOX defect count 155 detected by a residual FOX defect sensor 150, as discussed above in the description of FIGS. 10–11.

Turning to FIG. 23, in this particular embodiment, the nitride strip process characteristic parameters are measured and/or monitored by tool sensors (not shown). The outputs of these tool sensors are transmitted to a computer system 2330 over a line 2320. The computer system 2330 analyzes these sensor outputs to identify the characteristic parameters.

Returning, to FIG. 22, once the characteristic parameter is identified and measured, the method 2200 proceeds by modeling the measured and identified characteristic parameter, as set forth in box 2230. The computer system 2330 in FIG. 23 is, in this particular embodiment, programmed to model the characteristic parameter. The manner in which this modeling occurs will be implementation specific.

In the embodiment of FIG. 23, a database 2335 stores a plurality of models that might potentially be applied, depending upon which characteristic parameter is identified. This particular embodiment, therefore, requires some a priori knowledge of the characteristic parameters that might be measured. The computer system 2330 then extracts an appropriate model from the database 2335 of potential models to apply to the identified characteristic parameters. If the database 2335 does not include an appropriate model, then the characteristic parameter may be ignored, or the computer system 2330 may attempt to develop one, if so programmed. The database 2335 may be stored on any kind of computer-readable, program storage medium, such as an optical disk 2340, a floppy disk 2345, or a hard disk drive (not shown) of the computer system 2330. The database 2335 may also be stored on a separate computer system (not shown) that interfaces with the computer system 2330.

Modeling of the identified characteristic parameter may be implemented differently in alternative embodiments. For instance, the computer system 2330 may be programmed using some form of artificial intelligence to analyze the sensor outputs and controller inputs to develop a model on-the-fly in a real-time implementation. This approach might be a useful adjunct to the embodiment illustrated in FIG. 23, and discussed above, where characteristic parameters are measured and identified for which the database 2335 has no appropriate model.

The method 2200 of FIG. 22 then proceeds by applying the model to modify a nitride strip control input parameter, as set forth in box 2240. Depending on the implementation, applying the model may yield either a new value for the nitride strip control input parameter or a correction to the existing nitride strip control input parameter. The new nitride strip control input is then formulated from the value yielded by the model and is transmitted to the nitride strip processing tool controller 2315 over the line 2320. The nitride strip processing tool controller 2315 then controls subsequent nitride strip process operations in accordance with the new nitride strip control inputs.

Some alternative embodiments may employ a form of feedback to improve the modeling of characteristic parameters. The implementation of this feedback is dependent on several disparate facts, including the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention are implemented in software. For instance, the acts set forth in the boxes 2220–2240 in FIG. 22 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 2345 or the computer 2330 hard disk drive (not shown), or optical, such as the optical disk 2340. When these instructions are executed by a computer, they perform the disclosed functions. The computer may be a desktop computer, such as the computer 2330. However, the computer might alternatively be a processor embedded in the nitride strip processing tool 2310. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Figure 24:
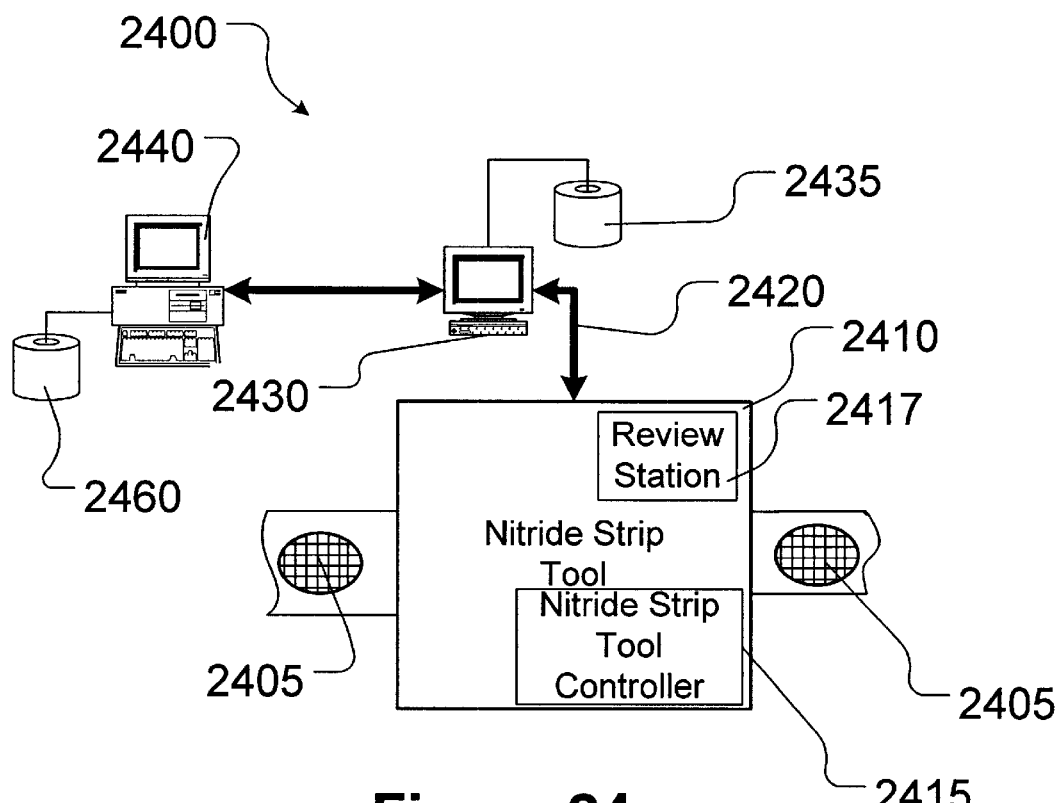
Figure 25:
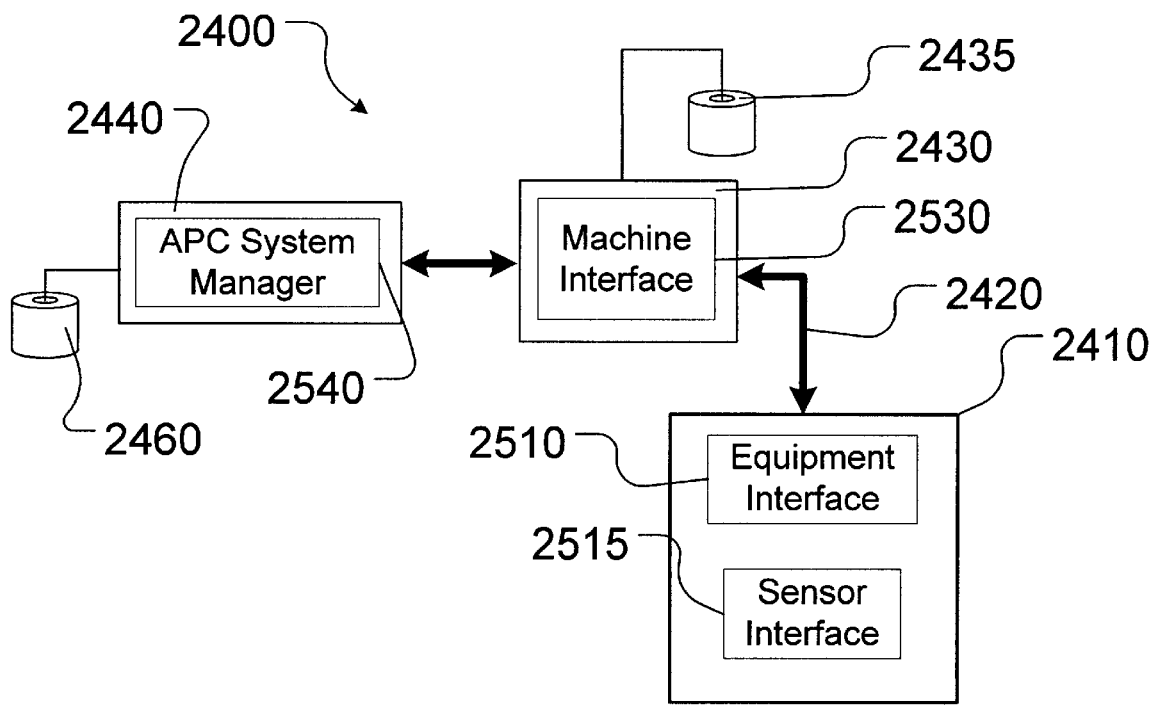

Construction of an Illustrative Apparatus. An exemplary embodiment 2400 of the apparatus 2300 in FIG. 23 is illustrated in FIGS. 24–25, in which the apparatus 2400 comprises a portion of an Advanced Process Control ("APC") system. FIGS. 24–25 are conceptualized, structural and functional block diagrams, respectively, of the apparatus 2400. A set of processing steps is performed on a lot of wafers 2405 on a nitride strip processing tool 2410. Because the apparatus 2400 is part of an APC system, the wafers 2405 are processed on a run-to-run basis. Thus, process adjustments are made and held constant for the duration of a run, based on run-level measurements or averages. A "run" may be a lot, a batch of lots, or even an individual wafer.

In this particular embodiment, the wafers 2405 are processed by the nitride strip processing tool 2410 and various operations in the process are controlled by a plurality of nitride strip control input signals on a line 2420 between the nitride strip processing tool 2410 and a workstation 2430. Exemplary nitride strip control inputs for this embodiment might include nitride stripping bath control input parameters for adding hot aqueous phosphoric acid ($H_3PO_4$) to the bath used to selectively etch the silicon nitride ($Si_3N_4$), draining the bath, stirring the bath, and the like.

When a process step in the nitride strip processing tool 2410 is concluded, the semiconductor wafers 2405 being processed in the nitride strip processing tool 2410 is examined in a review station 2417. The nitride strip control inputs generally affect the FOX thickness of the semiconductor wafers 2405 and, hence, the variability and properties of the dielectric film etched/deposited by the nitride strip processing tool 2410 on the wafers 2405. Once errors are determined from the examination after the run of a lot of wafers 2405, the nitride strip control inputs on the line 2420 are modified for a subsequent run of a lot of wafers 2405. Modifying the control signals on the line 2420 is designed to improve the next process step in the nitride strip processing tool 2410. The modification is performed in accordance with one particular embodiment of the method 2200 set forth in FIG. 22, as described more fully below. Once the relevant nitride strip control input signals for the nitride strip processing tool 2410 are updated, the nitride strip control input signals with new settings are used for a subsequent run of semiconductor devices.

Referring now to both FIGS. 24 and 25, the nitride strip processing tool 2410 communicates with a manufacturing framework comprising a network of processing modules. One such module is an APC system manager 2540 resident on the computer 2440. This network of processing modules constitutes the APC system. The nitride strip processing tool 2410 generally includes an equipment interface 2510 and a sensor interface 2515. A machine interface 2530 resides on the workstation 2430. The machine interface 2530 bridges the gap between the APC framework, e.g., the APC system manager 2540, and the equipment interface 2510. Thus, the machine interface 2530 interfaces the nitride strip processing tool 2410 with the APC framework and supports machine setup, activation, monitoring, and data collection. The sensor interface 2515 provides the appropriate interface environment to communicate with external sensors such as LabView® or other sensor bus-based data acquisition software. Both the machine interface 2530 and the sensor interface 2515 use a set of functionalities (such as a communication standard) to collect data to be used. The equipment interface 2510 and the sensor interface 2515 communicate over the line 2420 with the machine interface 2530 resident on the workstation 2430.

More particularly, the machine interface 2530 receives commands, status events, and collected data from the equipment interface 2510 and forwards these as needed to other APC components and event channels. In turn, responses from APC components are received by the machine interface 2530 and rerouted to the equipment interface 2510. The machine interface 2530 also reformats and restructures messages and data as necessary. The machine interface 2530 supports the startup/shutdown procedures within the APC System Manager 2540. It also serves as an APC data collector, buffering data collected by the equipment interface 2510, and emitting appropriate data collection signals.

In the particular embodiment illustrated, the APC system is a factory-wide software system, but this is not necessary to the practice of the invention. The control strategies taught by the present invention can be applied to virtually any semiconductor nitride strip processing tool on a factory floor. Indeed, the present invention may be simultaneously employed on multiple nitride strip processing tools in the same factory or in the same fabrication process. The APC framework permits remote access and monitoring of the process performance. Furthermore, by utilizing the APC framework, data storage can be more convenient, more flexible, and less expensive than data storage on local drives.

However, the present invention may be employed, in some alternative embodiments, on local drives.

The illustrated embodiment deploys the present invention onto the APC framework utilizing a number of software components. In addition to components within the APC framework, a computer script is written for each of the semiconductor nitride strip processing tools involved in the control system. When a semiconductor nitride strip processing tool in the control system is started in the semiconductor manufacturing fab, the semiconductor nitride strip processing tool generally calls upon a script to initiate the action that is required by the nitride strip processing tool controller. The control methods are generally defined and performed using these scripts. The development of these scripts can comprise a significant portion of the development of a control system.

In this particular embodiment, there are several separate software scripts that perform the tasks involved in controlling the nitride strip processing operation. There is one script for the nitride strip processing tool 2410, including the review station 2417 and the nitride strip processing tool controller 2415. There is also a script to handle the actual data capture from the review station 2417 and another script that contains common procedures that can be referenced by any of the other scripts. There is also a script for the APC system manager 2540. The precise number of scripts, however, is implementation specific and alternative embodiments may use other numbers of scripts.

Figure 26:
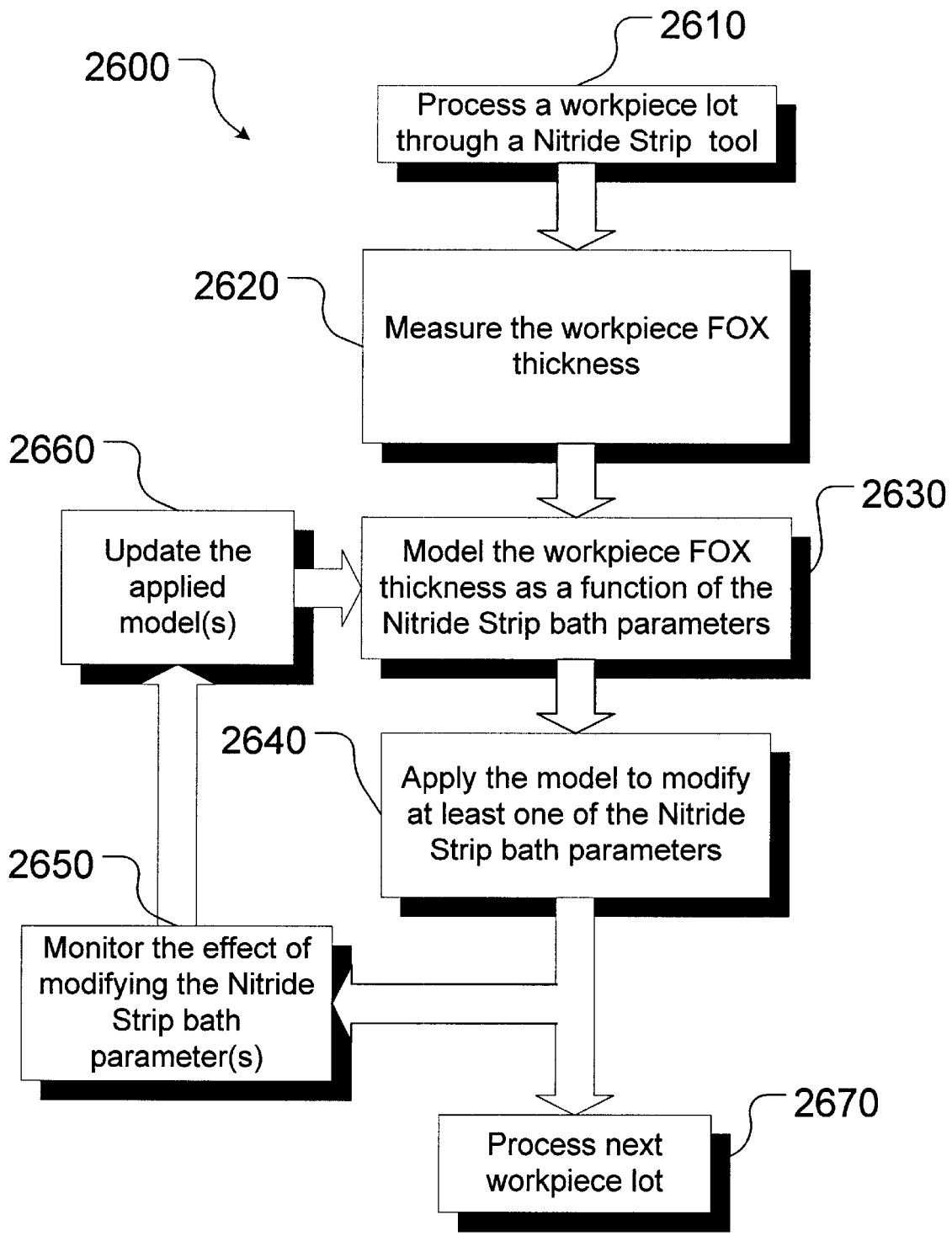

Operation of an Illustrative Apparatus. FIG. 26 illustrates one particular embodiment 2600 of the method 2200 in FIG. 22. The method 2600 may be practiced with the apparatus 2400 illustrated in FIGS. 24–25, but the invention is not so limited. The method 2600 may be practiced with any apparatus that may perform the functions set forth in FIG. 26. Furthermore, the method 2200 in FIG. 22 may be practiced in embodiments alternative to the method 2600 in FIG. 26.

Referring now to all of FIGS. 24–26, the method 2600 begins with processing a lot of wafers 2405 through a nitride strip processing tool 2410, as set forth in box 2610. In this particular embodiment, the nitride strip processing tool 2410 has been initialized for processing by the APC system manager 2540 through the machine interface 2530 and the equipment interface 2510. In this particular embodiment, before the nitride strip processing tool 2410 is run, the APC system manager script is called to initialize the nitride strip processing tool 2410. At this step, the script records the identification number of the nitride strip processing tool 2410 and the lot number of the wafers 2405. The identification number is then stored against the lot number in a data store 2460. The rest of the script, such as the APCData call and the Setup and StartMachine calls, are formulated with blank or dummy data in order to force the machine to use default settings.

As part of this initialization, the initial setpoints for nitride strip control are provided to the nitride strip processing tool controller 2415 over the line 2420. These initial setpoints may be determined and implemented in any suitable manner known to the art. In the particular embodiment illustrated, nitride strip controls are implemented by control threads. Each control thread acts like a separate controller and is differentiated by various process conditions. For nitride strip control, the control threads are separated by a combination of different conditions. These conditions may include, for example, the semiconductor nitride strip processing tool 2410 currently processing the wafer lot, the semiconductor product, the semiconductor manufacturing operation, and one or more of the semiconductor processing tools (not shown) that previously processed the semiconductor wafer lot.

Control threads are separated because different process conditions affect nitride strip error differently. By isolating each of the process conditions into its own corresponding control thread, the nitride strip error can become a more accurate portrayal of the conditions in which a subsequent semiconductor wafer lot in the control thread will be processed. Since the error measurement is more relevant, changes to the nitride strip control input signals based upon the error will be more appropriate.

The control thread for the nitride strip control scheme depends upon the current nitride strip processing tool, current operation, the product code for the current lot, and the identification number at a previous processing step. The first three parameters are generally found in the context information that is passed to the script from the nitride strip processing tool 2410. The fourth parameter is generally stored when the lot is previously processed. Once all four parameters are defined, they are combined to form the control thread name; NITR02_OPER01_PROD01_NITR01 is an example of a control thread name. The control thread name is also stored in correspondence to the wafer lot number in the data store 2460.

Once the lot is associated with a control thread name, the initial settings for that control thread are generally retrieved from the data store 2460. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the nitride strip errors as the nitride strip control input settings. It is preferred that the controllers use the default machine settings as the initial settings. By assuming some settings, the nitride strip errors can be related back to the control settings in order to facilitate feedback control.

Another possibility is that the initial settings are stored under the control thread name. In this case, one or more wafer lots have been processed under the same control thread name as the current wafer lot, and have also been measured for nitride strip error using the review station 2417. When this information exists, the nitride strip control input signal settings are retrieved from the data store 2460. These settings are then downloaded to the nitride strip processing tool 2410.

The wafers 2405 are processed through the nitride strip processing tool 2410. This includes, in the embodiment illustrated, dielectric film or layer etch and/or deposition and/or etch/deposition. The wafers 2405 are measured on the review station 2417 after their nitride strip processing on the nitride strip processing tool 2410. The review station 2417 examines the wafers 2405 after they are processed for a number of errors. The data generated by the instruments of the review station 2417 is passed to the machine interface 2530 via sensor interface 2515 and the line 2420. The review station script begins with a number of APC commands for the collection of data. The review station script then locks itself in place and activates a data available script. This script facilitates the actual transfer of the data from the review station 2417 to the APC framework. Once the transfer is completed, the script exits and unlocks the review station script. The interaction with the review station 2417 is then generally complete.

As will be appreciated by those skilled in the art having the benefit of this disclosure, the data generated by the review station 2417 should be preprocessed for use. Review stations, such as KLA review stations, provide the control algorithms for measuring the control error. Each of the error measurements, in this particular embodiment, corresponds to one of the nitride strip control input signals on the line 2420 in a direct manner. Before the error can be utilized to correct the nitride strip control input signal, a certain amount of preprocessing is generally completed.

For example, preprocessing may include outlier rejection. Outlier rejection is a gross error check ensuring that the received data is reasonable in light of the historical performance of the process. This procedure involves comparing each of the nitride strip errors to its corresponding predetermined boundary parameter. In one embodiment, even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Preprocessing may also smooth the data, which is also known as filtering. Filtering is important because the error measurements are subject to a certain amount of randomness, such that the error significantly deviates in value. Filtering the review station data results in a more accurate assessment of the error in the nitride strip control input signal settings. In one embodiment, the nitride strip control scheme utilizes a filtering procedure known as an Exponentially-Weighted Moving Average ("EWMA") filter, although other filtering procedures can be utilized in this context.

One embodiment for the EWMA filter is represented by Equation (1):

$$AVG_N = W^* M_C + (1-W)^* AVG_P \quad (1)$$

where $AVG_N$≡the new EWMA average;

W≡a weight for the new average ($AVG_N$);

$M_C$≡the current measurement; and $AVG_P$≡the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through a nitride strip processing tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the nitride strip control input signal settings.

The nitride strip processing tool controller 2415, in this particular embodiment, uses limited storage of data to calculate the EWMA filtered error, i.e., the first technique. Wafer lot data, including the lot number, the time the lot was processed, and the multiple error estimates, are stored in the data store 2460 under the control thread name. When a new set of data is collected, the stack of data is retrieved from data store 2460 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 258 hours old is removed. Once the aforementioned steps are complete, the new filter average is calculated and stored to data store 2460.

Thus, the data is collected and preprocessed, and then processed to generate an estimate of the current errors in the nitride strip control input signal settings. First, the data is passed to a compiled Matlab® plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 26, data preprocessing includes measuring a characteristic parameter in a nitride strip operation, such as workpiece 2405 FOX thickness, arising from nitride strip processing control of the nitride strip processing tool 2410, as set forth in box 2620. Known, potential characteristic parameters may be identified by characteristic data patterns or may be identified as known consequences of modifications to control input parameters. The example of how changes in silicon (Si) concentration in the nitride stripping bath affect FOX thickness variability given above falls into this latter category.

The next step in the control process is to calculate the new settings for the nitride strip processing tool controller 2415 of the nitride strip processing tool 2410. The previous settings for the control thread corresponding to the current wafer lot are retrieved from the data store 2460. This data is paired along with the current set of nitride strip errors. The new settings are calculated by calling a compiled Matlab® plug-in. This application incorporates a number of inputs, performs calculations in a separate execution component, and returns a number of outputs to the main script. Generally, the inputs of the Matlab® plug-in are the nitride strip control input signal settings, the review station errors, an array of parameters that are necessary for the control algorithm, and a currently unused flag error. The outputs of the Matlab® plug-in are the new controller settings, calculated in the plug-in according to the controller algorithm described above.

A nitride strip process engineer or a control engineer, who generally determines the actual form and extent of the control action, can set the parameters. They include the threshold values, maximum step sizes, controller weights, and target values. Once the new parameter settings are calculated, the script stores the setting in the data store 2460 such that the nitride strip processing tool 2410 can retrieve them for the next wafer lot to be processed. The principles taught by the present invention can be implemented into other types of manufacturing frameworks.

Returning again to FIG. 26, the calculation of new settings includes, as set forth in box 2630, modeling the identified characteristic parameter. This modeling may be performed by the Matlab® plug-in. In this particular embodiment, only known, potential characteristic parameters are modeled and the models are stored in a database 2435 accessed by a machine interface 2530. The database 2435 may reside on the workstation 2430, as shown, or some other part of the APC framework. For instance, the models might be stored in the data store 2460 managed by the APC system manager 2540 in alternative embodiments. The model will generally be a mathematical model, i e., an equation describing how the change(s) in nitride stripping bath control(s) affects the nitride strip performance and the FOX thickness variability from wafer to wafer and/or from run to run, and the like.

The particular model used will be implementation specific, depending upon the particular nitride strip processing tool 2410 and the particular characteristic parameter being modeled. Whether the relationship in the model is linear or non-linear will be dependent on the particular parameters involved.

The new settings are then transmitted to and applied by the nitride strip processing tool controller 2415. Thus, returning now to FIG. 26, once the identified characteristic parameter is modeled, the model is applied to modify at least one nitride stripping bath control input parameter, as set forth in box 2640. In this particular embodiment, the machine interface 2530 retrieves the model from the database 2435, plugs in the respective value(s), and determines the necessary change(s) in the nitride stripping bath control input parameter(s). The change is then communicated by the machine interface 2530 to the equipment interface 2510 over the line 2420. The equipment interface 2510 then implements the change.

The present embodiment furthermore provides that the models be updated. This includes, as set forth in boxes 2650–2660 of FIG. 26, monitoring at least one effect of modifying the nitride stripping bath control input parameters (box 2650) and updating the applied model (box 2660) based on the effect(s) monitored. For instance, various aspects of the nitride strip processing tool 2410's operation will change as the hot aqueous phosphoric acid ($H_3PO_4$) bath, used to selectively etch silicon nitride ($Si_3N_4$) in the nitride strip processing tool 2410, ages. By monitoring the effect of the nitride stripping bath change(s) implemented as a result of the characteristic parameter (e.g., workpiece 2405 FOX thickness and/or residual FOX defect count 155) measurement, the necessary value could be updated to yield superior performance.

As noted above, this particular embodiment implements an APC system. Thus, changes are implemented "between" lots. The actions set forth in the boxes 2620–2660 are implemented after the current lot is processed and before the second lot is processed, as set forth in box 2670 of FIG. 26. However, the invention is not so limited. Furthermore, as noted above, a lot may constitute any practicable number of wafers from one to several thousand (or practically any finite number). What constitutes a "lot" is implementation specific, and so the point of the fabrication process in which the updates occur will vary from implementation to implementation.

Any of the above-disclosed embodiments of a method of manufacturing according to the present invention enables the use of central values and spreads of FOX thickness measurements sent from a measuring tool to make run-to-run processing tool adjustments, either manually and/or automatically, to improve and/or better control the yield. Additionally, any of the above-disclosed embodiments of a method of manufacturing according to the present invention enables semiconductor device fabrication with increased device density and precision, increased efficiency and increased signal-to-noise ratio for the metrology tools, enabling a streamlined and simplified process flow, thereby decreasing the complexity and lowering the costs of the manufacturing process and increasing throughput.

Any of the above-disclosed embodiments of a method of manufacturing according to the present invention enables the monitoring and control of the FOX thickness following a nitride stripping and/or etching process step. As consecutive lots of workpieces (such as silicon wafers with various process layers formed thereon) are processed through a nitride stripping and/or etching process step, any of the above-disclosed embodiments of a method of manufacturing according to the present invention enables the monitoring and control of the silicon concentration in the stripping and/or etching bath, decreasing the FOX thickness variations. In particular, the FOX thickness will be more uniform from run to run and/or batch to batch, leading to a decreased number of residual FOX defects, further raising the workpiece throughput and further decreasing the workpiece manufacturing costs.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing, the method comprising:

processing a first workpiece in a nitride processing step;

measuring a thickness of a field oxide feature formed on the first workpiece;

forming an output signal corresponding to the thickness of the field oxide feature; and feeding back a control signal based on the output signal to adjust processing performed on a second workpiece in the nitride processing step to adjust a thickness of a field oxide feature formed on the second workpiece toward at least a threshold value.

2. The method of claim 1, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

3. The method of claim 2, wherein draining the portion of the chemical bath used in the nitride processing step includes determining the portion of the chemical bath to be drained based on the output signal.

4. The method of claim 2, wherein adding the fresh chemicals to the chemical bath includes determining an amount of the fresh chemicals based on the output signal.

5. The method of claim 2, wherein draining the portion of the chemical bath used in the nitride processing step and adding the fresh chemicals to the chemical bath includes determining the portion of the chemical bath to be drained and determining an amount of the fresh chemicals based on the output signal.

6. A method of manufacturing, the method comprising:
processing a first workpiece in a nitride processing step;
measuring a thickness of a field oxide feature formed on the first workpiece;
detecting residual field oxide defects on the first workpiece;
forming an output signal corresponding to the thickness of the field oxide feature and the residual field oxide defects; and
feeding back a control signal based on the output signal to adjust processing performed on a second workpiece in the nitride processing step to adjust a thickness of a field oxide feature formed on the second workpiece toward at least a threshold value and to reduce residual field oxide defects on the second workpiece.

7. The method of claim 6, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

8. The method of claim 7, wherein draining the portion of the chemical bath used in the nitride processing step includes determining the portion of the chemical bath to be drained based on the output signal.

9. The method of claim 7, wherein adding the fresh chemicals to the chemical bath includes determining an amount of the fresh chemicals based on the output signal.

10. The method of claim 7, wherein draining the portion of the chemical bath used in the nitride processing step and adding the fresh chemicals to the chemical bath includes determining the portion of the chemical bath to be drained and determining an amount of the fresh chemicals based on the output signal.

11. A method of manufacturing, the method comprising:
processing a first workpiece in a nitride processing step;
measuring thicknesses of a plurality of field oxide features formed on the first workpiece;
forming an output signal corresponding to the thicknesses of the plurality of field oxide features; and
feeding back a control signal based on the output signal to adjust processing performed on a second workpiece in the nitride processing step to adjust a thickness of a field oxide feature formed on the second workpiece toward at least a predetermined threshold value.

12. The method of claim 11, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

13. The method of claim 12, wherein draining the portion of the chemical bath used in the nitride processing step includes determining the portion of the chemical bath to be drained based on the output signal.

14. The method of claim 12, wherein adding the fresh chemicals to the chemical bath includes determining an amount of the fresh chemicals based on the output signal.

15. The method of claim 12, wherein draining the portion of the chemical bath used in the nitride processing step and adding the fresh chemicals to the chemical bath includes determining the portion of the chemical bath to be drained and determining an amount of the fresh chemicals based on the output signal.

16. A method of manufacturing, the method comprising:
processing a first workpiece in a nitride processing step;
measuring thicknesses of a plurality of field oxide features formed on the first workpiece;
detecting residual field oxide defects on the first workpiece;
forming an output signal corresponding to the thicknesses of the plurality of field oxide features and the residual field oxide defects; and
feeding back a control signal based on the output signal to adjust processing performed on a second workpiece in the nitride processing step to adjust a thickness of a field oxide feature formed on the second workpiece toward at least a predetermined threshold value and to reduce residual field oxide defects on the second workpiece.

17. The method of claim 16, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

18. The method of claim 17, wherein draining the portion of the chemical bath used in the nitride processing step includes determining the portion of the chemical bath to be drained based on the output signal.

19. The method of claim 17, wherein adding the fresh chemicals to the chemical bath includes determining an amount of the fresh chemicals based on the output signal.

20. The method of claim 17, wherein draining the portion of the chemical bath used in the nitride processing step and adding the fresh chemicals to the chemical bath includes determining the portion of the chemical bath to be drained and determining an amount of the fresh chemicals based on the output signal.

21. A computer-readable, program storage device, encoded with instructions that, when executed by a computer, perform a method for manufacturing a workpiece, the method comprising:
processing a first workpiece in a nitride processing step;
measuring a thickness of a field oxide feature formed on the first workpiece;
forming an output signal corresponding to the thickness of the field oxide feature; and
feeding back a control signal based on the output signal to adjust processing performed on a second workpiece in the nitride processing step to adjust a thickness of a field oxide feature formed on the second workpiece toward at least a predetermined threshold value.

22. The device of claim 21, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

23. The device of claim 22, wherein draining the portion of the chemical bath used in the nitride processing step includes determining the portion of the chemical bath to be drained based on the output signal.

24. The device of claim 22, wherein adding the fresh chemicals to the chemical bath includes determining an amount of the fresh chemicals based on the output signal.

25. The device of claim 22, wherein draining the portion of the chemical bath used in the nitride processing step and adding the fresh chemicals to the chemical bath includes determining the portion of the chemical bath to be drained and determining an amount of the fresh chemicals based on the output signal.

26. A computer programmed to perform a method of manufacturing, the method comprising:

processing a first workpiece in a nitride processing step;

measuring a thickness of a field oxide feature formed on the first workpiece;

forming an output signal corresponding to the thickness of the field oxide feature; and feeding back a control signal based on the output signal to adjust processing performed on a second workpiece in the nitride processing step to adjust a thickness of a field oxide feature formed on the second workpiece toward at least a predetermined threshold value.

27. The computer of claim 26, wherein feeding back the control signal based on the output signal to adjust processing performed on the second workpiece in the nitride processing step includes adding fresh chemicals to a chemical bath used in the nitride processing step and, if the chemical bath is substantially full, draining a portion of the chemical bath.

28. The computer of claim 27, wherein draining the portion of the chemical bath used in the nitride processing step includes determining the portion of the chemical bath to be drained based on the output signal.

29. The computer of claim 27, wherein adding the fresh chemicals to the chemical bath includes determining an amount of the fresh chemicals based on the output signal.

30. The computer of claim 27, wherein draining the portion of the chemical bath used in the nitride processing step and adding the fresh chemicals to the chemical bath includes determining the portion of the chemical bath to be drained and determining an amount of the fresh chemicals based on the output signal.

* * * * *